United States Patent [19]

Miyazaki et al.

[11] Patent Number: 5,491,438
[45] Date of Patent: Feb. 13, 1996

[54] SYNCHRONIZED CLOCK GENERATING APPARATUS

[75] Inventors: Yukio Miyazaki; Takenori Okitaka; Makoto Hatakenaka; Junji Mano, all of Itami, Japan

[73] Assignee: Mitsubishi Denki Kabushiki Kaisha, Tokyo, Japan

[21] Appl. No.: 289,837

[22] Filed: Aug. 12, 1994

Related U.S. Application Data

[63] Continuation of Ser. No. 809,007, Dec. 17, 1991, abandoned.

[30] Foreign Application Priority Data

Dec. 26, 1990 [JP] Japan ..................... 2-406357
Aug. 1, 1991 [JP] Japan ..................... 3-193033
Nov. 11, 1991 [JP] Japan ..................... 3-293988

[51] Int. Cl.⁶ ..................................... H03L 7/00
[52] U.S. Cl ................... 327/144; 327/146; 327/154; 327/155
[58] Field of Search ..................... 307/269, 510, 307/511, 519, 602; 328/63; 327/141, 144, 146, 155, 154, 2, 3, 12, 102, 233, 284, 285

[56] References Cited

U.S. PATENT DOCUMENTS 4,626,716 12/1986 Miki ........................ 307/590
4,675,612 6/1987 Adams et al. ................ 328/63
4,713,621 12/1987 Nakamura et al. ............ 328/55
4,754,164 6/1989 Flora et al. ................. 307/269
5,073,730 12/1991 Hoffman ..................... 307/269
5,087,829 2/1992 Ishibashi et al. ............ 307/269
5,103,185 4/1992 Arai ......................... 328/165

FOREIGN PATENT DOCUMENTS 63-41466 8/1988 Japan.
1320482 of 1989 Japan.

Primary Examiner—Terry Cunningham
Attorney, Agent, or Firm—Christopher R. Pastel; Herbert F. Ruschmann; Thomas R. Morrison

[57] ABSTRACT

A synchronized clock generating apparatus includes a delayed clock generating circuit including a plurality of serially connected delaying elements for generating delayed clock signals delayed successively relative to an incoming basic clock signal. Storage means includes a plurality of storage elements storing therein a predetermined level in response to transitions occurring in associated ones of said basic and delayed clock signals after a trigger signal which is asynchronous with the basic clock signal is applied thereto. A clock selection logic circuit is controlled by the output signal of the storage means for detecting the clock signal transition occurring closest in time to the application of the asynchronous trigger signal, and for selecting a desired one of said clock signals, based on the result of the detection, as a synchronized clock signal output.

14 Claims, 19 Drawing Sheets

SYNCHRONIZED CLOCK GENERATING APPARATUS

This application is a continuation of application Ser. No. 07/809,007, filed Dec. 17, 1991, now abandoned.

This invention relates to a synchronized clock generating apparatus which can provide a high frequency clock signal which is synchronized with an externally applied asynchronous trigger input signal.

BACKGROUND OF THE INVENTION

The only conventional method for the improving synchronization precision of an output clock which is synchronized with an asynchronous trigger input has been to increase the frequency of an input clock signal. For instance, for a high synchronization precision of 1 nanosecond, an input clock signal at a high frequency of 1 GHz should be used. However, increasing the frequency of the input clock signal up to 1 GHz will cause problems, such as the generation of internal noise and the generation of undesirable radiations, and, accordingly, such a method is not feasible.

Furthermore, to form a 1 GHz clock signal generating circuit and its associated frequency-divider by ordinary CMOS circuit technique is not easy, and, therefore, it requires special technique, such as the very high speed bipolar technique, which considerably increases the manufacturing costs of the apparatus.

FIG. 1 is a block diagram of a conventional synchronized clock generating apparatus, and FIG. 2 shows various waveforms that represent the operation of the apparatus of FIG. 1. A high frequency clock sisal CK generated by a high frequency clock signal generating circuit 102 is applied to a clock input terminal A of a counter 103 and also to a clock input terminal A of a frequency-divider 104. A trigger input terminal B of counter 103 receives, as a count enable signal, a trigger signal TR via a trigger input terminal 100 from a trigger signal source 105. The trigger signal TR is asynchronous with the clock signal CK.

The counter 103 starts counting the number of clock pulses of the high frequency clock signal CK from the high frequency clock generating circuit 102, immediately after a transition $t_1$ (FIG. 2) in the trigger signal TR from a high logic level H to a low logic level L. When the count reaches a prescribed value, for example, 3, counter 103 generates a frequency-division enable signal DE for application to an enable signal input terminal B of frequency-divider 104. In response to the frequency-division enable signal DE applied to the enable signal input terminal B, frequency-divider 104 starts frequency-division of the high frequency clock signal CK and produces an output clock signal $CK_{out}$ having a transition occurring every four cycles, for example, of the high frequency clock signal CK.

With the above-described conventional clock signal generating apparatus, the output clock signal $CK_{out}$ will be produced with the same timing even if the H-to-L transition $t_1$ in the trigger signal TR varies within a range T defined by broken lines. Accordingly, in order to increase the precision of synchronization of the output clock signal $CK_{out}$, the frequency of the high frequency clock signal CK must be increased. The synchronization precision becomes higher as the frequency of the high frequency clock signal CK becomes higher. Thus, the relationship between them can be expressed as, Synchronization Precision ≡ Period of High Frequency Clock Signal.

An object of the present invention is to provide a synchronized clock generating apparatus which can generate an output clock signal with a high synchronization precision without resorting to the use of a higher frequency basic clock signal.

Another object of the present invention is to generate an output clock signal which is shifted by substantially a constant time from a level change in a trigger signal applied asynchronously with the basic clock signal, regardless of the timing of the application of the asynchronous trigger signal relative to the basic clock signal.

Still another object of the present invention is to provide a synchronous clock generating apparatus which can produce an output clock signal having a jitter no greater than about ±1 nanosecond, without resorting to the use of a circuit which generates a clock signal at such a high frequency as 1 GHz.

SUMMARY OF THE INVENTION

The synchronized clock generating apparatus according to the present invention includes a delayed clock generating circuit which further includes a plurality of serially connected delaying elements and provides a plurality of delayed clock signals which are successively delayed versions of a basic clock signal applied to it. The apparatus further includes storage means comprising a plurality of storage elements for storing a predetermined logic level in response to a change in the level of the basic or delayed clock signal occurring after the application of a trigger signal which is asynchronous with the basic clock signal. A clock selection logic circuit is provided which is controlled by the output signal of the storage means to detect a change in the clock signals including the basic and delayed clock signals, which occurs at a time closest to the time of application of the asynchronous trigger signal, and to select a desired one of the clock signals in accordance with the detection of the closest occurrence of the level change. The selected clock signal is provided as a synchronized output clock signal.

A synchronized clock generating apparatus according to a preferred embodiment of the present invention employs, as the storage means, a plurality of flip-flops each of which receives an associated one of the basic and delayed clock signals, and a trigger signal asynchronous with any of the clock signals, and is set or reset in response to a change in level of the associated basic or delayed clock signal occurring after the asynchronous trigger signal is applied to it. The clock selection circuit employed in this preferred embodiment comprises logic circuits associated with the respective ones of the flip-flops, and feedback means. One of the logic circuits is responsive to the output of that one of the flip-flops which is first set or reset, for selecting that clock signal which has first set or reset that flip-flop. The feedback means feeds the outputs of the logic circuits back to the inputs of the associated flip-flops to cause the flip-flops to hold their states. The clock selection circuit may be arranged to select a desired one of the clock signals preceding or succeeding the clock signal which has first set or reset one of the flip-flops.

In a synchronized clock generating apparatus according to another preferred embodiment of the present invention, a plurality of logic circuits is associated with the respective ones of the flip-flops. The logic circuit associated with the flip-flop which has been first set or reset provides a logic operation for the output Q of the associated flip-flop and the output Q of one of the flip-flops preceding the said associated flip-flop, and the logic circuit uses the result of the logic operation to select a desired one of the basic and delayed clock signals. The feedback means feeds the outputs of the respective logic circuits back to their associated flip-flops to cause them to hold their states.

The above, and other objects, features and advantages of the present invention will become apparent from the following description read in conjunction with the accompanying drawings, in which like reference numerals designate the same elements.

DETAILED DESCRIPTION OF THE INVENTION

Now the present invention is described in detail with reference to the drawings.

Embodiment 1

Figure 1:
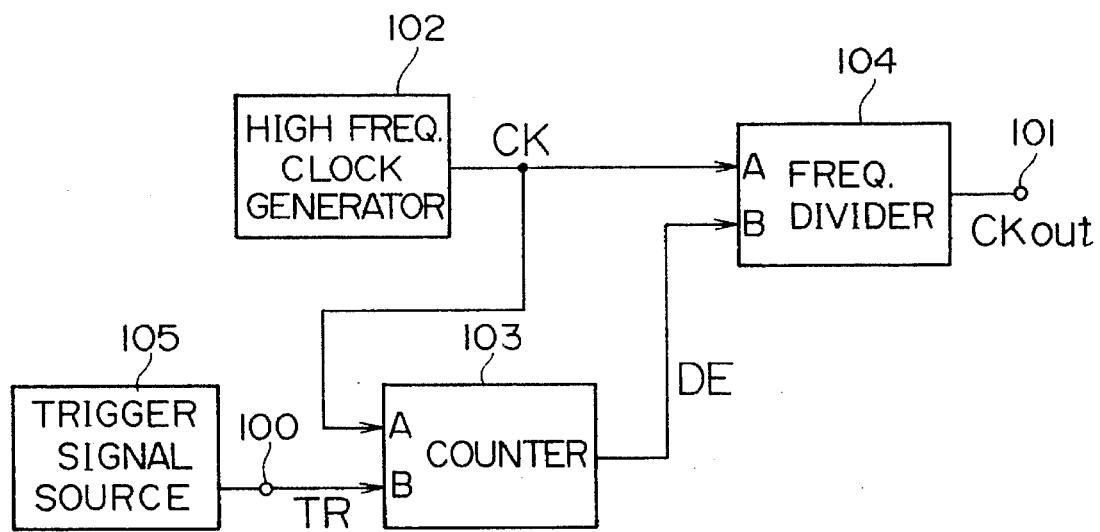
FIG. 1 is a block diagram of an example of a conventional synchronized clock generating apparatus.
Figure 2:
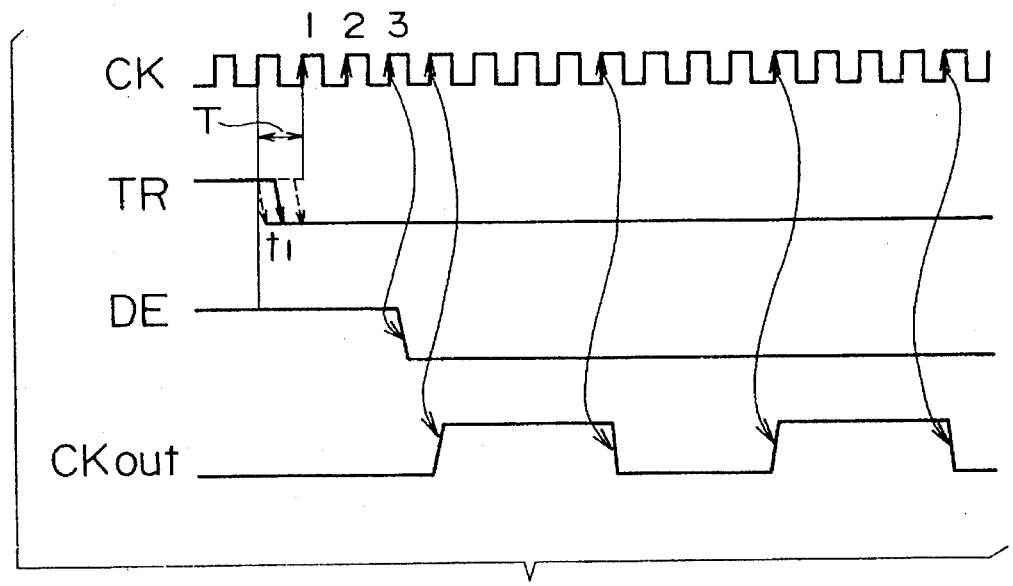
FIG. 2 is a timing diagram for use in explaining the operation of the conventional synchronized clock generating apparatus shown in FIG. 1.
Figure 3:
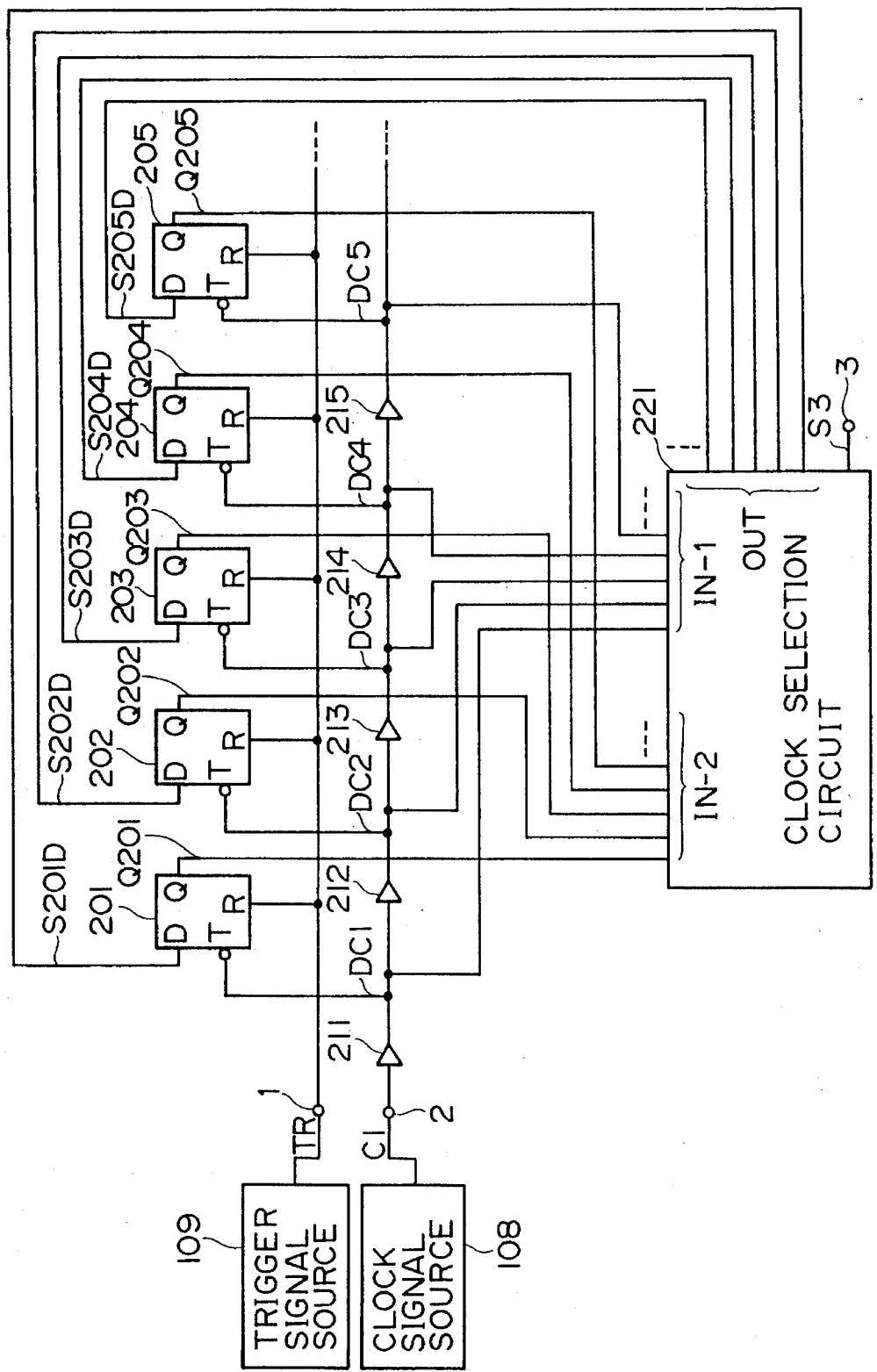
FIG. 3 is a block diagram of a synchronized clock generating apparatus according to one embodiment of the present invention.

FIG. 3 shows, in block form, a synchronized clock generating apparatus according to a first embodiment of the present invention.

A basic clock signal C1 applied to a clock input terminal 2 from a clock signal source 108 is coupled to all input terminal of a first delaying element 211 of a delayed-clock generating circuit which includes a plurality of delaying elements in addition to the delaying element 211. In FIG. 3, only five such delaying elements 211–215 are shown and described. A delayed clock signal DC1 from delaying element 211 is coupled to the delaying element 212 which provides a delayed clock signal DC2. Similarly, output delayed signals DC2, DC3, DC4 and DC5 from the respective delaying elements 212, 213, 214 and 215 are applied to the inputs of the succeeding ones of the delaying elements. The delaying elements may be buffer amplifiers, for example.

The output delayed clock signal DC1 from delaying element 211 is applied to a negative-logic clock input terminal T of a flip-flop 201. The output delayed clock signal DC2 from delaying element 212 is applied to a negative-logic clock input terminal T of a flip-flop 202. In a similar manner, output delayed clock signals DC3, DC4, and DC5 from respective delaying elements 213, 214, and 215 are applied to negative-logic clock input terminals T of flip-flops 203, 204, and 205, respectively. The delayed clock signals DC1–DC5 are also applied to one set of input terminals IN-1 of a clock selection circuit 221.

An asynchronous trigger signal TR is applied from a trigger signal source 109 through a trigger signal input terminal 1 to RESET input terminals R of the respective flip-flops 201–205. Output signals Q201–Q205 from data output terminals Q of the respective flip-flops 201–205 are applied to another set of input terminals IN-2 of clock selection circuit 221. Further, output signals S201D–S205D at the output terminals OUT of clock selection circuit 221 are coupled to DATA input terminals D of flip-flops 201–205, respectively.

As stated previously, there may be more delaying elements and flip-flops than shown in FIG. 3, but delaying elements succeeding delaying element 215 and flip-flops succeeding the flip-flop 205 are not shown or described.

Figure 4:
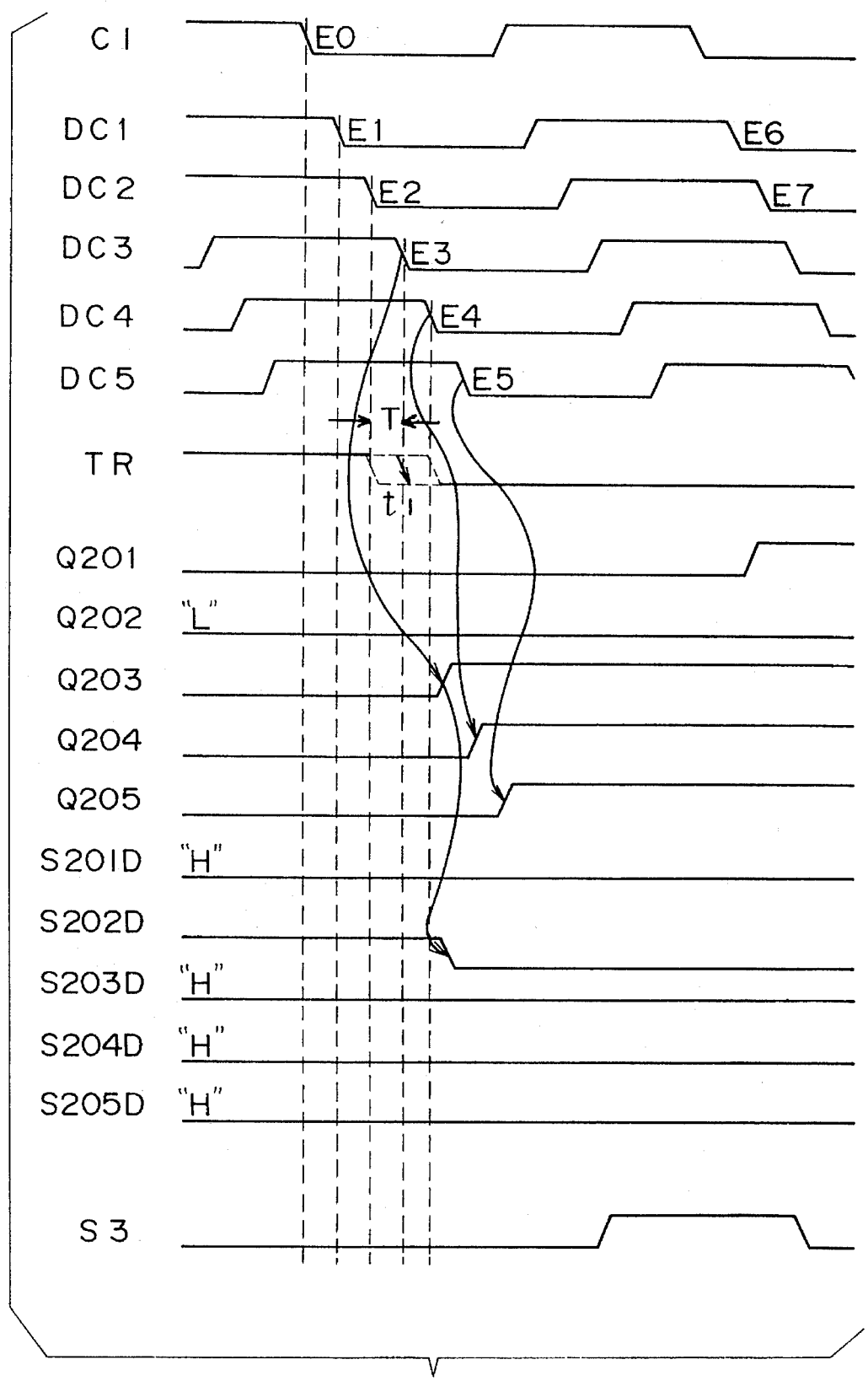
FIG. 4 is a timing diagram for use in explaining the operation of the synchronized clock generating apparatus shown in FIG. 3.

Next, the operation of the circuit shown in FIG. 3 is described. FIG. 4 is a timing chart for use in explaining the operation of the circuit of FIG. 3. As shown in FIG. 4, the basic clock signal C1 is successively delayed by the delaying elements 211–215 by a predetermined time so that the delayed clock signals DC1–DC5 are provided.

Now, let it be assumed that a transition from the "H" level to the "L" level occurs in the trigger signal TR at a time t, as shown. This transition places RESET input terminals R of flip-flops 201–205 at the "L" level so as to enable the flip-flops. The flip-flops 201–205 start accepting data into them upon receiving falling edges of the clock signals applied to their respective clock signal input terminals T. When falling edges E1 and E2 occurred in delayed clock signals DC1 and DC2, respectively, from delaying elements 211 and 212, trigger signal TR was still at "H" level and, therefore, flip-flops 201 and 202 could not operate. The flip-flops 201 and 202 can operate when next falling edges E6 and E7 occur in delayed clock signals DC1 and DC2, respectively, and provide the levels of the signals present, at respective DATA input terminals D at the times of the occurrence of the edges E6 and E7, to their own outputs Q as their output signals Q201 and Q202, respectively. As will be explained later, the DATA input terminals D of the flip-flops 201 and 202 at the occurrence of the edges E6 and E7 are at the "H" and "L" levels, respectively.

When falling edges E3, E4 and E5 occur in the delayed clock signals DC3, DC4 and DC5 from the delaying elements 213, 214 and 215, respectively, the trigger signal TR is at the "L" level, the flip-flops 203, 204 and 205 provide the levels present at their respective DATA input terminals D at the occurrence of the respective falling edges E3, E4 and E5, to their output terminals Q, as output signals Q203, Q204 and Q205, respectively. As will be explained later, since input signals S201D–S205D applied from clock selection circuit 221 to the DATA input terminals D of the flip-flops 201–205, respectively, are initially all at the "H" level, output signals Q203–Q205 of the flip-flops 203–205 are at the "H" level.

The clock selection circuit 221 detects the delayed clock signal corresponding to that one of the output signals Q201–Q205 of the flip-flops 201–205 which rises earliest in time, that is, that one (the delayed clock signals DC3 in the embodiment shown in FIGS. 3 and 4) of the delayed clock signals DC1–DC5 which has a rising edge closest in time to the falling edge of the trigger signal TR. The clock selection circuit 221 selects a desired one of the delayed clock signals DC1–DC5 (DC3 in the embodiment shown in FIGS. 3 and 4) in accordance with the detected delayed clock signal, and provides it as a synchronized clock signal S3 from a synchronized clock output terminal 3. Furthermore, the clock selection circuit 221 sets the levels at the DATA input terminals D of the flip-flops 201–205 to maintain the selected condition. The clock selection circuit 221 will be described in detail later.

Embodiment 2

Figure 5:
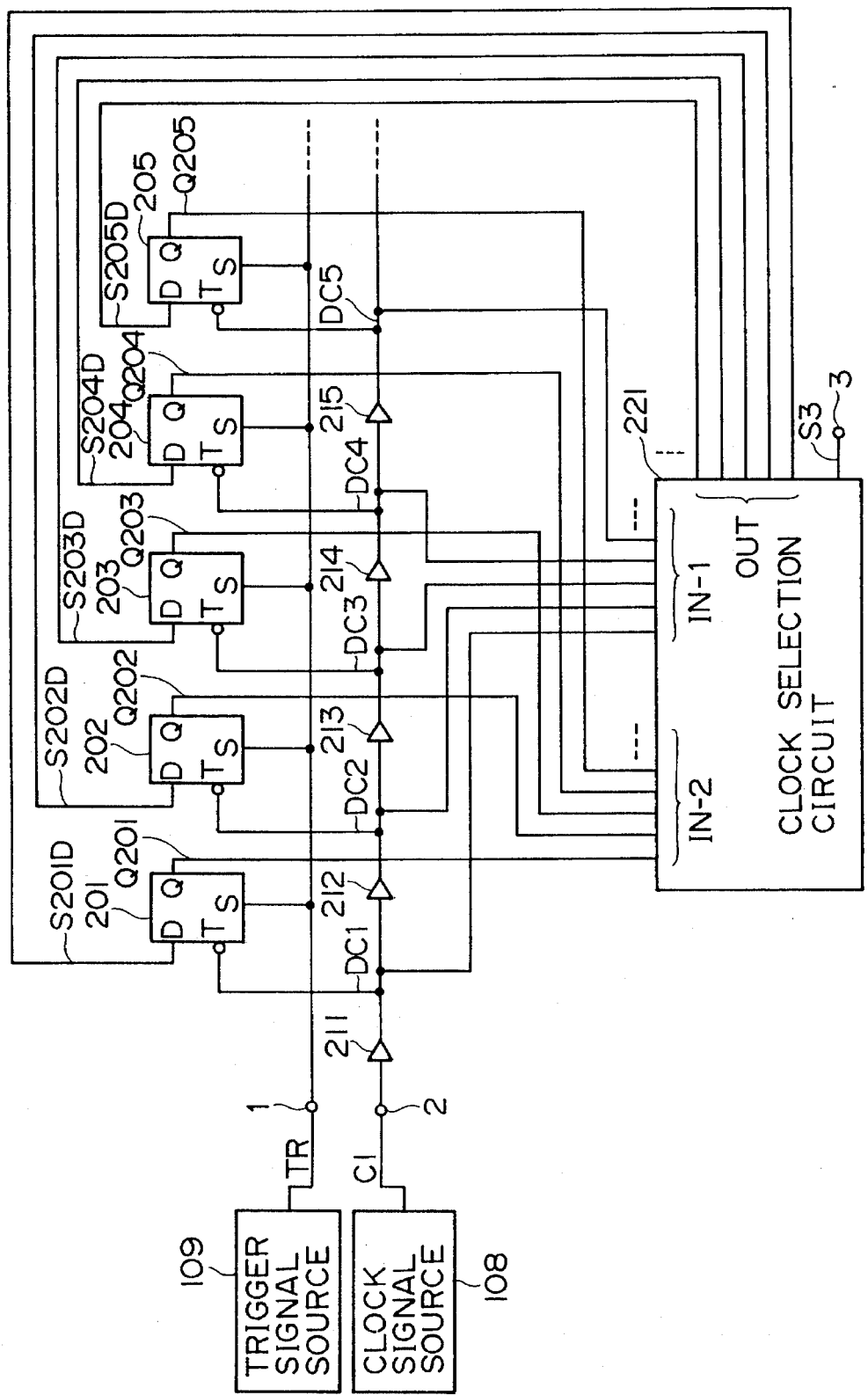
FIG. 5 is a block diagram of a synchronized clock generating apparatus according to a second embodiment of the present invention.

FIG. 5 shows a synchronized clock generating apparatus according to a second embodiment of the present invention. The synchronized clock generating apparatus according to the second embodiment is similar to the apparatus of the first embodiment, except that the asynchronous trigger signal TR is applied to SET input terminals S, rather than to the RESET input terminals, of the respective flip-flops 201–205. Another difference between the first and second embodiments is that the output signals appearing at the set of output terminals OUT of the clock selection circuit 221 in the second embodiment, are polarity-inverted versions of the output signals S201D–S205D shown in FIG. 4, which explains the operation of the first embodiment. A further difference between the first and second embodiments is that the output signals of the flip-flops 201–205 in the second embodiment are polarity-inverted versions of the output signals Q201–Q205 shown in FIG. 4. Accordingly, in FIG. 5, the same reference numerals and symbols represent components and functions equivalent to those shown in FIG. 3, and the description is omitted.

Figure 4A:
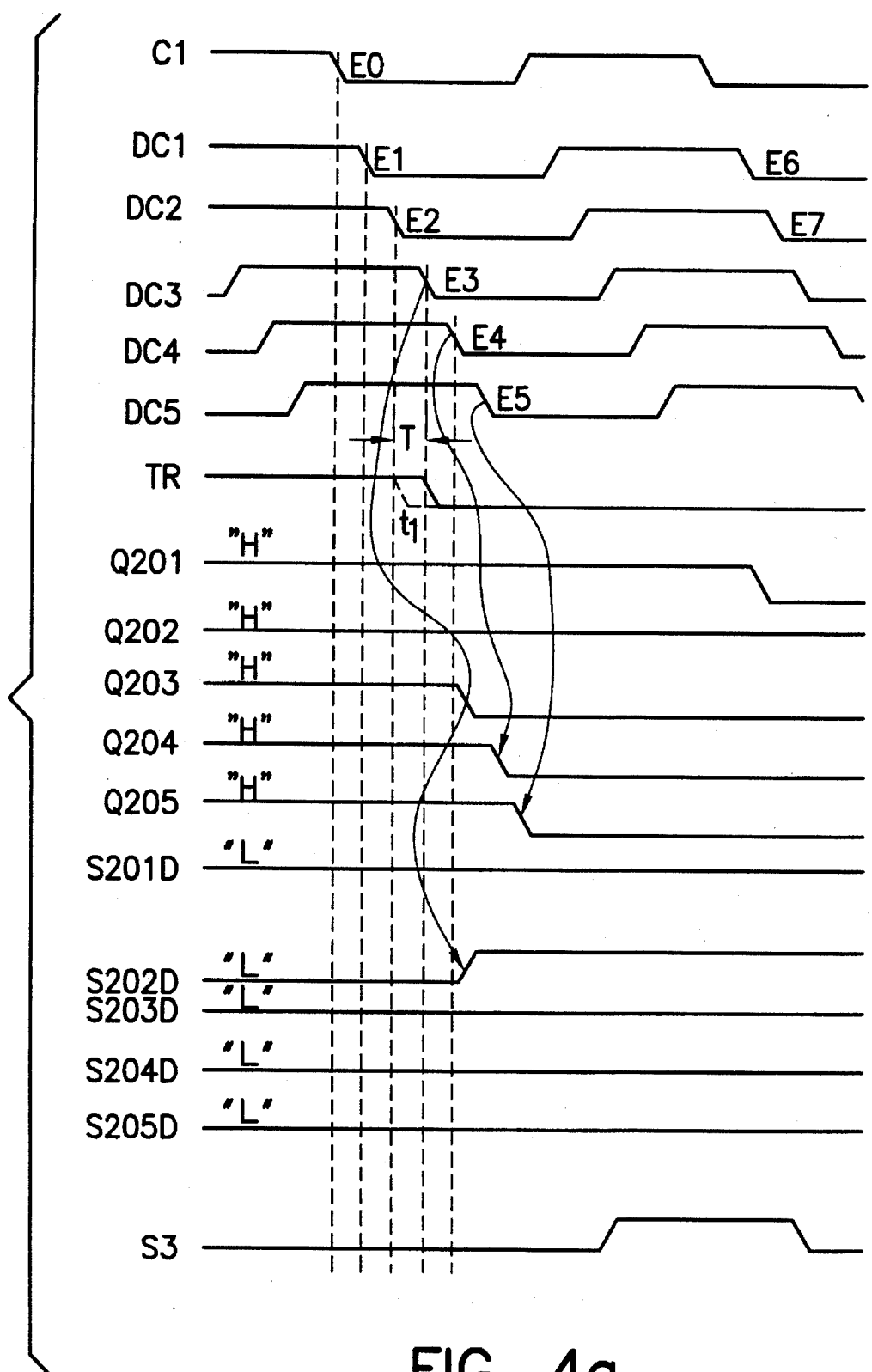
FIG. 4(a) is a timing diagram for use in explaining the operation of the synchronized clock generating apparatus shown in FIG. 5.

FIG. 4(a) shows the timing diagram for the second embodiment.

In the first and second embodiments shown in FIGS. 3 and 5, even if the time of triggering by the asynchronous trigger signal varies within a range T indicated by broken lines in FIG. 4, the states of the output signals Q201–Q205 of the flip-flops 201–205 will not change, and the synchronized clock signal S3 appears at a fixed time. In other words, the synchronization precision of the apparatus can be approximated to the time delay provided by one delaying element, from among the delaying elements 211–215, or it may be expressed approximately as, Synchronization Precision=Delay Time Provided by One Delaying Element In the field of semiconductor integrated circuits, it is easy to set the delay time provided by one delaying element to 1 ns or less, so that the present invention can provide a considerably higher synchronization precision than conventional circuits.

Figure 6:
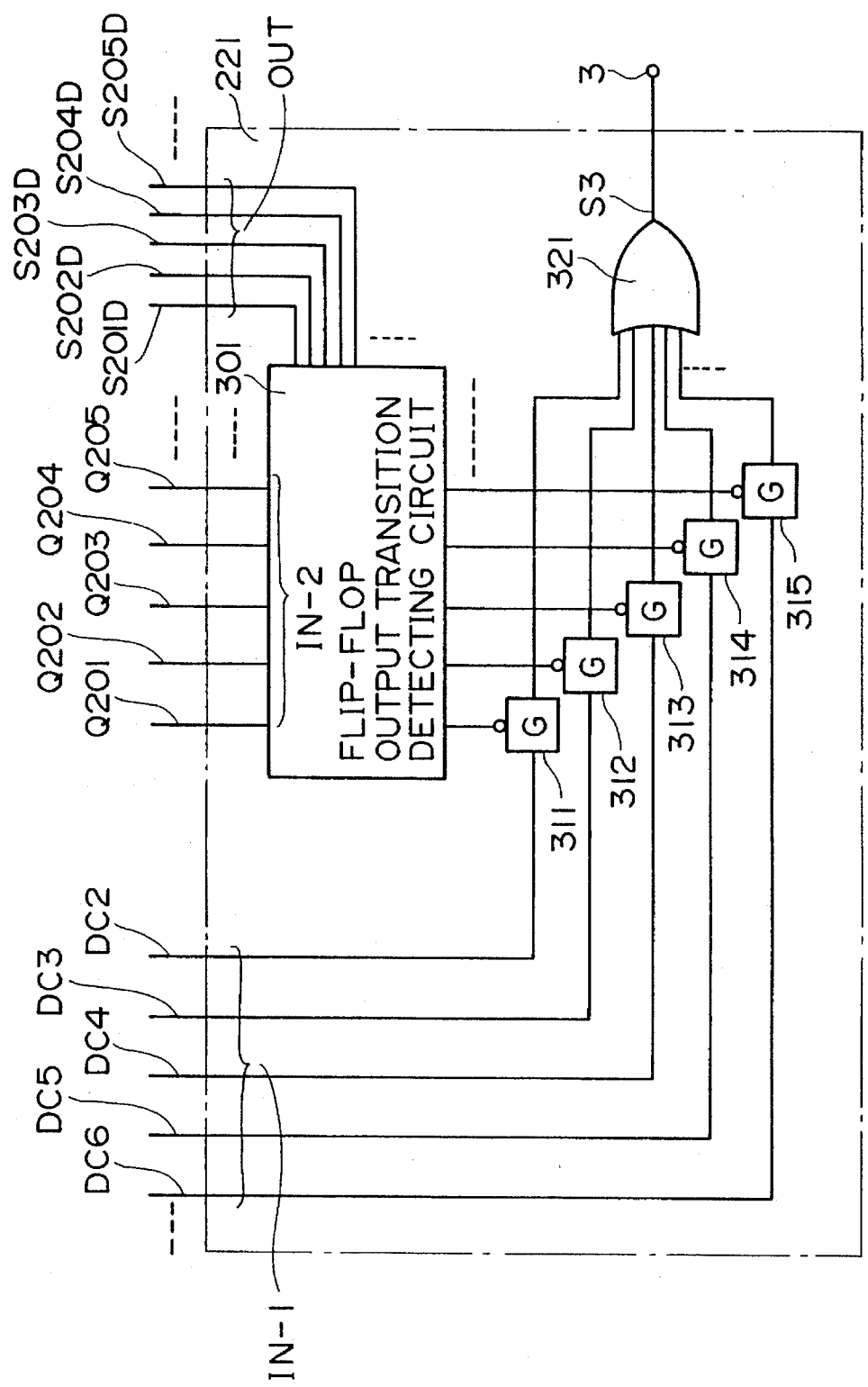
FIG. 6 as used in the circuit of FIG. 3; shows an example of a clock selection circuit usable in the synchronized clock generating apparatus shown in FIGS. 3 and 5.

FIG. 6 is a circuit diagram of an example of the clock selection circuit 221 usable in the synchronized clock generating apparatus of FIGS. 3 and 5. As shown in FIG. 6, the output signals Q201–Q205 of the flip-flops 201–205 are applied via a set of input terminals IN-2 of the clock selection circuit 221 to a flip-flop output transition detecting circuit 301. The outputs of the flip-flop output transition detecting circuit 301 are connected to respective gate terminals G for controlling the conduction of switches 311–315. The output delayed clock signals DC2–DC6 (DC6 is not shown in FIG. 4) of the delaying elements 212–216 (216 is not shown in FIGS. 3 and 5) are applied respectively through a set of input terminals IN-1 to the input terminals of the switches 311–315, and the respective output terminals of the switches 311–315 are connected to the inputs of a multiple-input OR circuit 321. The output of the multiple-input OR circuit 321 is connected to the synchronized clock signal output terminal 3. The output signals S201D–S205D of the flip-flop transition detecting circuit 301 are returned to the DATA input terminals D of the flip-flops 201–205 shown in FIG. 3 or 5.

Figure 7:
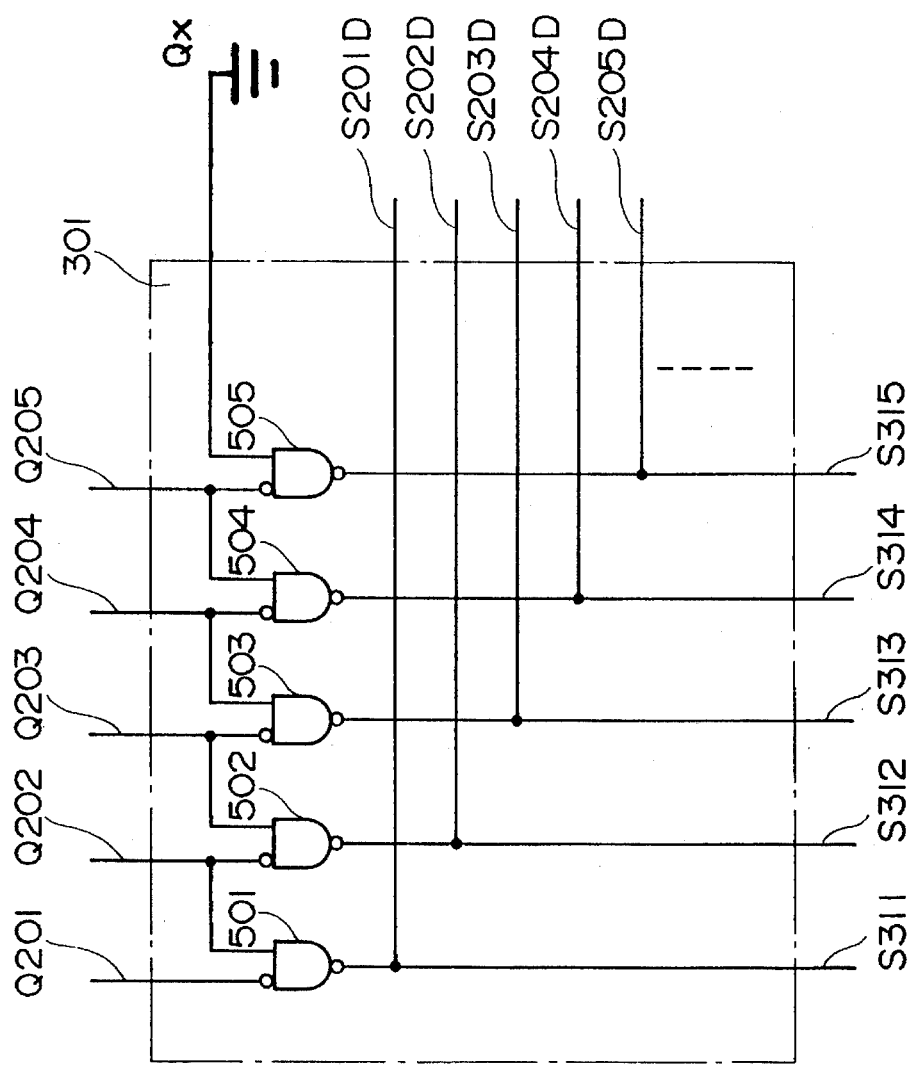
FIG. 7 shows an example of a circuit for detecting changes in output of flip-flops of the clock selection circuit shown in FIG. 6.

FIG. 7 is a circuit diagram of one example of the flip-flop output transition detecting circuit 301 which is a part of the clock selection circuit 221 in the embodiment shown in FIG. 3. The output signal of one of two adjacent ones of the flip-flops 201–205 is inverted, while the output signal of the other is non-inverted, and they are applied to the associated ones of NAND circuits 501–505. When one of the signals applied to each NAND circuit is at the "L" level and the other is at the "H" level, that NAND circuit produces an output signal at the "L" level. Otherwise it produces an output signal at the "H" level. These output signals S311–S315 of the NAND circuits 501–505 are applied to the DATA input terminals D of the associated ones of the flip-flops 201–205 of FIG. 3, as the previously stated signals S201D–S205D. In the apparatus of FIG. 5 the signals S311–S315 are inverted and then, applied to the DATA input terminals of the flip-flops 201–205 as the signals S201D–S205D.

Now the operation of the clock selection circuit 221 shown in FIG. 6 and the operation of the flip-flop output transition detecting circuit 301 shown in FIG. 7 are described. In the flip-flop output transition detecting circuit 301, one of the output signals of two adjacent ones of the flip-flops 201–205, after being inverted, and the other of the two output signals as it is, are compared in an associated one of the NAND circuits 501–505. Only one of the NAND circuits 501–505 that receives a signal at the "L" level and a signal at the "H" level produces an "L" level output signal. (It should be noted that initially all of the output signals S311–S315 of the NAND circuits 501–505 are at the "H" level.) The "L" level output signal renders conductive that one of the switches 311–315 to which it is applied. In the example shown in FIG. 4, the NAND circuit 502 provides the output signal S312 at the "L" level, which signal turns on the switch 312. When one of the switches 311–315 shown in FIG. 6 becomes conductive, the corresponding one of the delayed clock signals DC1–DC5 (the delayed clock signal DC3 in the example shown in FIG. 4) is applied through the conducting switch to the input of the OR circuit 321, and appears at the output of the OR circuit 321 as the synchronized clock signal S3. It is then applied to the synchronized clock output terminal 3.

The output from the NAND circuit 502 associated with the conductive switch 312 changes to the "L" level in response to the change of the output Q203 of the flip-flop 203 to the "H" level, and the output is returned as the signal S202D to the DATA input terminal D of the flip-flop 202. Therefore, even when the next falling edge E7 occurs in the delayed clock signal DC2 as shown in FIG. 4, the output signal Q202 of the flip-flop 202 remains at the "L" level and, the output of the NAND circuit 502 remains at the "L" level.

Figure 8:
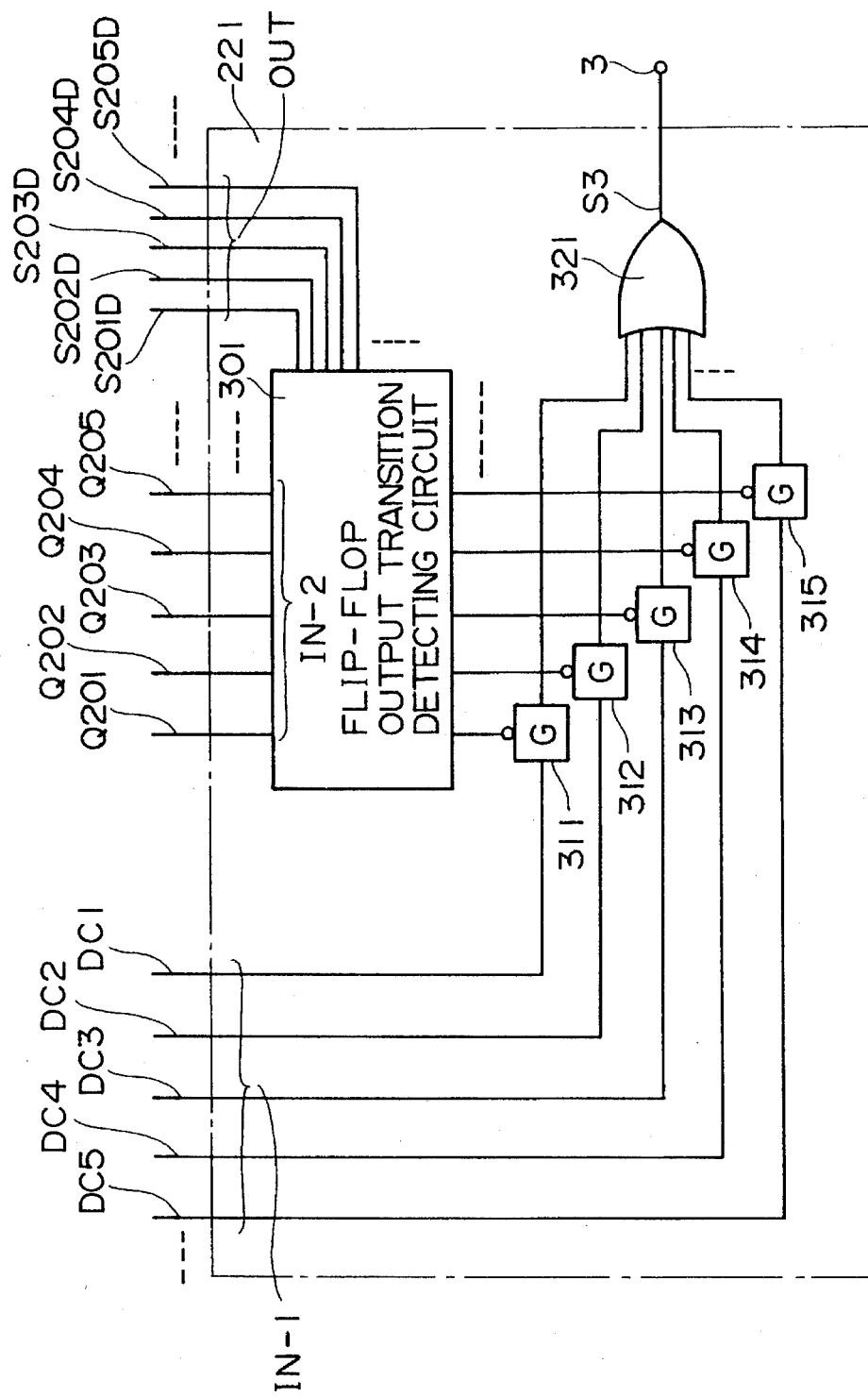
FIG. 8 shows another example of a clock selection circuit usable in the synchronized clock generating apparatus shown in FIGS. 3 and 5.

FIG. 8 shows another example of the clock selection circuit. This circuit differs from the circuit shown in FIG. 6 in the manner of coupling of the delayed clock signals to the switches. More specifically, the delayed clock signals DC1–DC5 are coupled to the input terminals of the respective switches 311–315. The remaining portion of the clock selection circuit of FIG. 8 is the same as the circuit of FIG. 6.

In the clock selection circuit shown in FIG. 8, the synchronized clock signal S3 developed at the synchronized clock output terminal 3 differs from the signal S3 provided from the circuit of FIG. 6 under the same timing condition. For example, under the condition where the delayed clock signal DC2 is selected by the circuit of FIG. 6, the delayed clock signal DC1 is selected by the circuit of FIG. 8. In contrast to the delayed clock signal DC3 selected by the FIG. 6 circuit, the delayed clock signal DC2 is selected by the circuit of FIG. 8. Similarly, the delayed clock signal developed at the synchronized clock output terminal 3 as the synchronized clock signal S3 can be shifted by one. Thus, by changing the coupling between the delayed clock signals and the switches, a desired one of the delayed clock signals can be derived as the synchronized clock signal S3 at the synchronized clock output terminal 3.

The circuit shown in FIG. 6 cannot select the output delayed clock signal DC1 of the first delaying element 211 as the synchronized clock signal S3, while the circuit shown in FIG. 8 cannot select the delayed clock signal from the last delaying element. However, the circuit of FIG. 6 can be arranged to select, as the synchronized clock signal S3, a delayed clock signal which is in phase with the delayed clock signal DC1, by using a number of delaying elements to impart to the basic clock signal C1 an amount of delay equal to longer than one period of the clock signal so that such an in-phase clock signal appears after the delayed clock signal DC5. Also, in the circuit shown in FIG. 8, by using a number of delaying elements to impart an amount of delay greater than one period of the basic clock signal C1 so that a delayed clock signal which is in phase with the delayed clock signal provided by the last delaying element can appear before the delayed clock signal from the last delaying element, the delayed clock signal, which is in phase with the last delayed clock signal, can be selected as the synchronized clock signal S3.

In the embodiments described thus far, the effective edge of the clock signals at the clock input terminals T of the flip-flops 201–205 is described as a negative-going edge, but a positive-going edge can be used instead.

Furthermore, the coupling of the delayed clock signals to the switches is not limited to the circuit shown in FIGS. 6 and 8.

In the embodiments thus far described, a desired delayed clock signal is selected as the synchronized clock pulse output, using that delayed clock signal which has a transition (edge) occurring after and closest in time to a transition (edge) in the trigger signal TR applied to the asynchronous trigger signal input terminal 1. However, a delayed clock signal having a transition occurring before and closest in time to a transition in the asynchronous trigger signal TR may be used in selecting a desired delayed clock signal as the synchronized clock signal S3. Alternatively, any delayed clock signal occurring closest in time to a transition in the asynchronous trigger signal TR, regardless of whether it occurs before or after the trigger signal transition, may be used in selecting a desired delayed clock signal as the synchronized clock signal S3.

Embodiment 3

Figure 9:
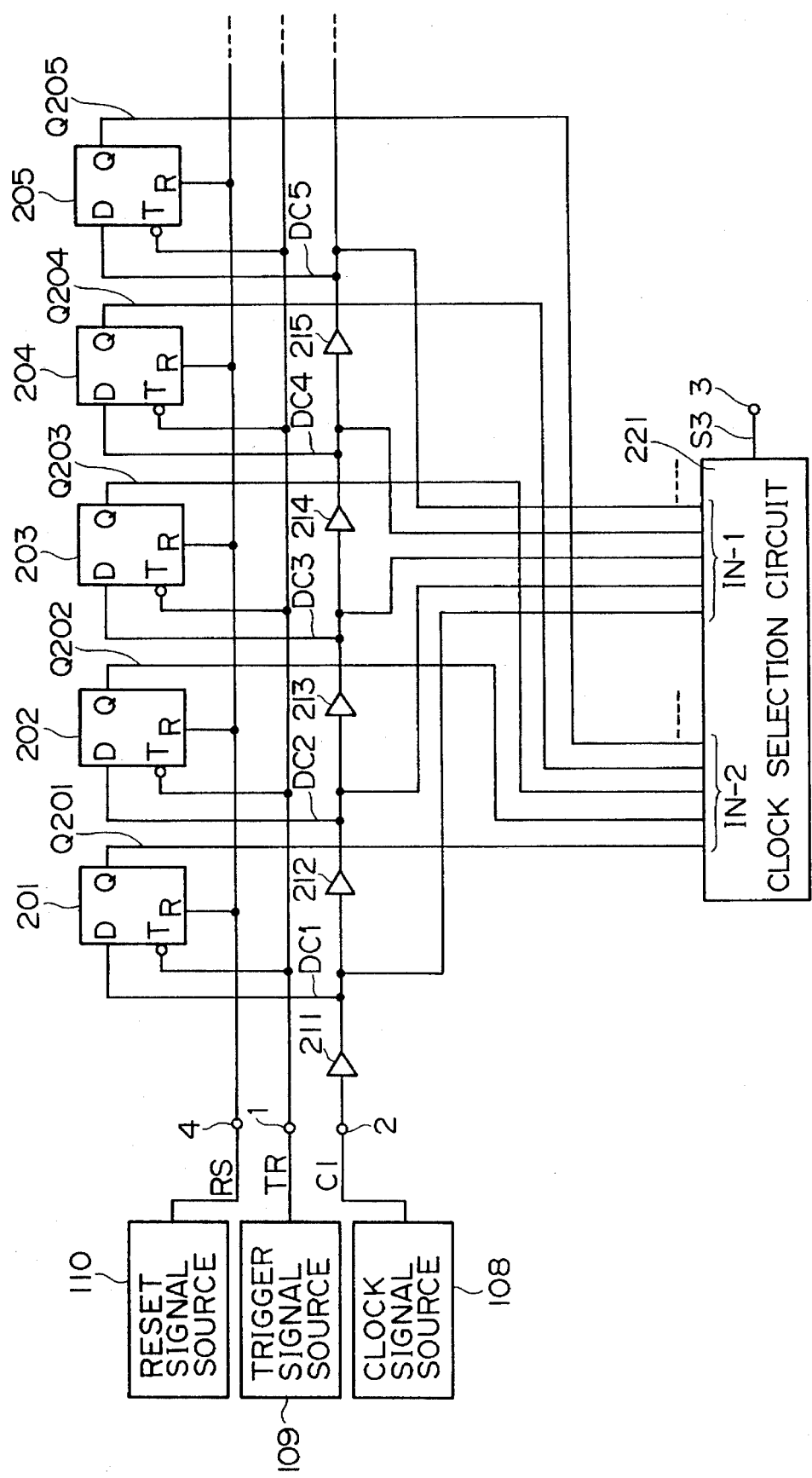
FIG. 9 is a block diagram of a synchronized clock generating apparatus according to a third embodiment of the present invention.

FIG. 9 is a block diagram of a synchronized clock generating apparatus according to a third embodiment of the present invention. A basic clock signal C1 applied at a basic clock input terminal 2 from a clock signal source 108 is fed to the input of a first-stage delaying element 211 of a delayed clock generating circuit. An output delayed clock signal DC1 of the delaying element 211 is applied to the input of a next-stage delaying element 212, and so on. Thus, the basic clock signal C1 at the input terminal 1 is delayed successively by delaying elements 211–215 of the delayed clock generating circuit.

The delayed clock signal DC1 from the delaying element 211 is applied to a DATA input terminal D of a flip-flop 201, and a delayed clock signal DC2 which is an output of the delaying element 212 is applied to a DATA input terminal D of a flip-flop 202. Similarly, output delayed clock signals DC1–DC5 from the respective delaying elements 211–215 are applied to the DATA input terminals of their associated flip-flops 201–205. The delayed clock signals DC1–DC5 are also applied to a set of input terminals IN-1 of a clock selection circuit 221.

An asynchronous trigger signal TR applied to a trigger signal input terminal 1 from a trigger signal source 109 is fed to a negative-logic CLOCK input terminal T of each of the flip-flops 201–205. A reset signal RS at a reset signal input terminal 4 applied from a reset signal source 110 is fed to a RESET input terminal R of each of the flip-flops 201–205. The output signals Q201–Q205 from the DATA output terminals Q of the flip-flops 201–205 are applied to another set of input terminals IN-2 of the clock selection circuit 221.

In FIG. 9, more delaying elements and flip-flops than shown may be used, but delaying elements succeeding the delaying element 215 and flip-flops succeeding the flip-flop 205 are not shown.

Now the operation of the apparatus shown in FIG. 9 is described with reference to FIG. 10 which is a timing chart illustrating the operation of the FIG. 9 apparatus. The basic clock signal C1 is successively delayed by delaying elements 211–215 by a predetermined amount so that delayed clock signals DC1–DC5 are produced.

The flip-flops 201–205 are enabled when the reset signal RS falls to the "L" level at a time t, so that the RESET input terminals R of the flip-flops 201–205 are set to the "L" level.

Figure 10:
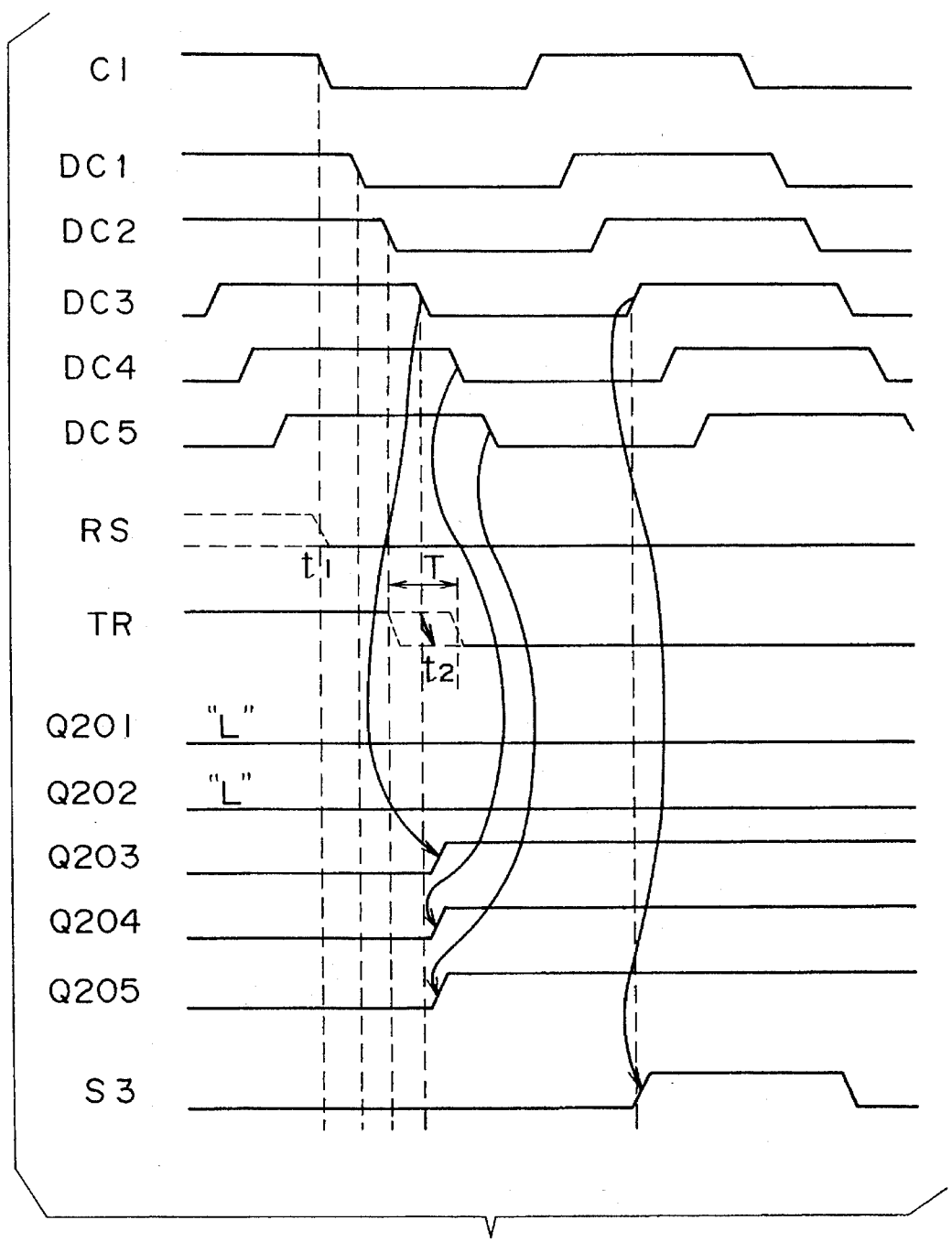
FIG. 10 is a timing diagram for use in explaining the operation of the synchronized clock generating apparatus shown in FIG. 9.

As shown in FIG. 10, when a transition from the "H" level to the "L" level occurs in the asynchronous trigger signal TR, the respective flip-flops 201–205 take in data currently present at their DATA input terminals D. At that time, the delayed clock signals DC1 and DC2, which are the outputs of the delaying elements 211 and 212, are at the "L" level, and the delayed clock signals DC3, DC4 and DC5, which are the outputs of the delaying elements 213, 214 and 215, are at the "H" level. Accordingly, the output signals Q201–Q205 of the flip-flops 201–205 are as shown in FIG. 10.

The clock selection circuit 221 detects one of the delayed clock signals DC1–DC5, which corresponds to that one of the output signals Q201–Q205 of the flip-flops 201–205 which has the earliest positive-going transition, or to that one of the delayed clock signals which has the transition closest in time to the transition in the asynchronous trigger signal TR. In the embodiment shown in FIGS. 9 and 10, the delayed clock signal to be selected is the delayed clock signal DC3. Then, using the detected delayed clock signal, the clock selection circuit 221 selects a desired one of the delayed clock signals DC1–DC5 and provides it as a synchronized clock signal S3 at its synchronized clock output terminal 3. The delayed clock signal selected as the synchronized clock signal S3 is the clock signal DC3 in the embodiment shown in FIGS. 9 and 10. The clock selection circuit 221 will be described in detail later.

In the embodiment shown in FIGS. 9 and 10, even if the transition in the asynchronous trigger signal TR varies in time within a range T indicated by broken lines in FIG. 10, the states of the output signals Q201–Q205 of the flip-flops 201–205 do not change, so the synchronous clock signal S3 can be provided in the same interval. The precision of synchronization can be approximated to an amount of delay provided by one delaying element, 211–215. That is, the precision of synchronization may be approximately expressed as, Synchronization Precision=Delay Time Provided by One Delaying Element In the field of semiconductor integrated circuits, it is easy to set a delay time provided by one delaying element to be 1 ns or less, so that a considerably higher synchronization precision is provided by the apparatus of the present invention than by conventional circuits.

Figure 11:
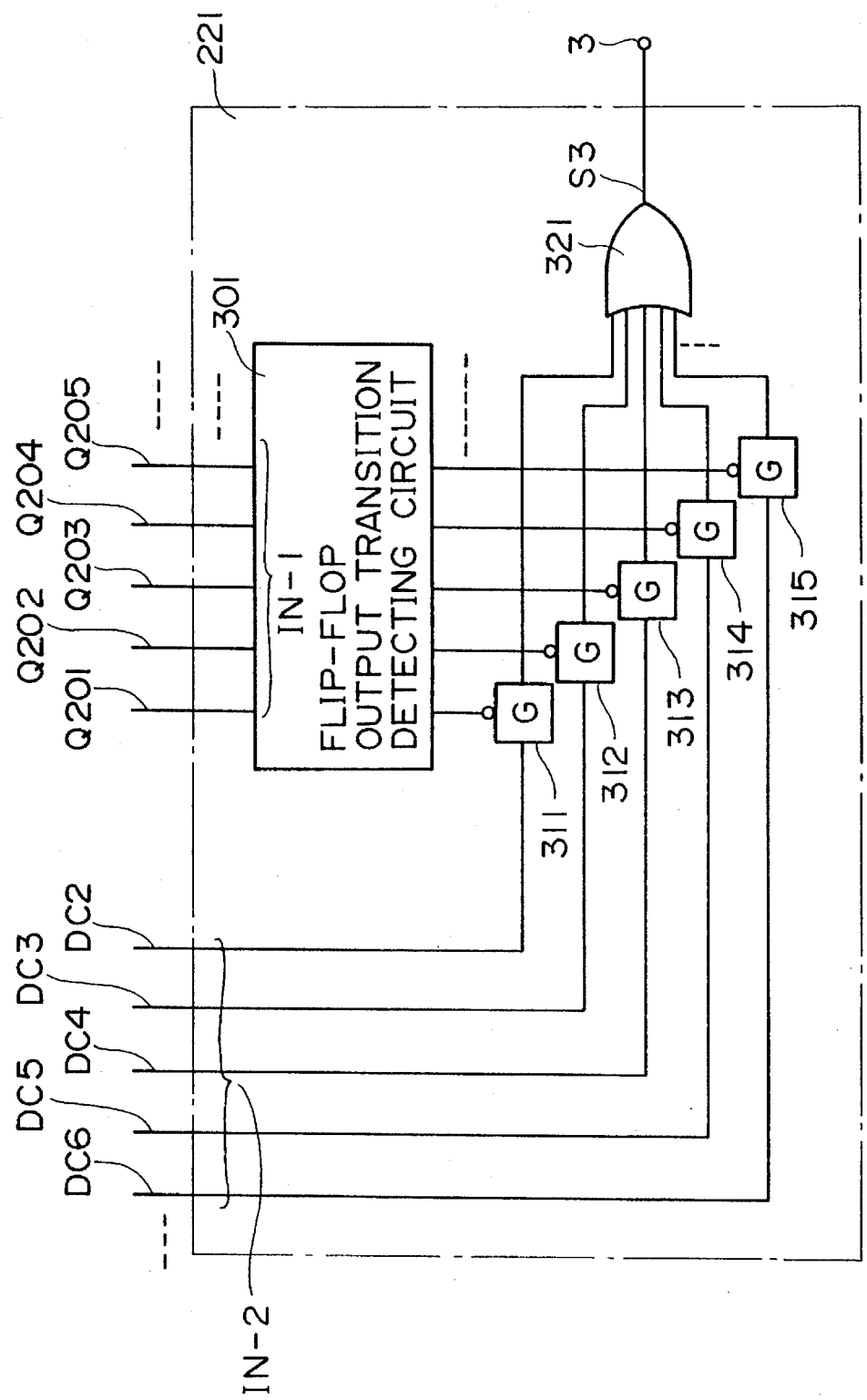
FIG. 11 shows an example of a clock selection circuit usable in the synchronized clock generating apparatus shown in FIG. 9.

FIG. 11 is a circuit diagram showing one example of the clock selection circuit 221 usable in the synchronized clock generating apparatus according to the third embodiment shown in FIG. 9. As shown in FIG. 11, the output signals Q201–Q205 from the flip-flops 201–205 applied to a set of input terminals IN-1 of the clock selection circuit 221 are coupled to a flip-flop output transition detecting circuit 301 of which outputs are coupled to gate terminals G of switches 311–315 for controlling the conduction thereof. The delayed clock signals DC2–DC6, which are the outputs of the delaying elements 212–216 (the delaying element 216 is not shown in FIG. 9), are applied through a set of input terminals IN-2 to the input terminals of the switches 311–315. The switches 311–315 have their respective outputs coupled to inputs of a multiple-input OR circuit 321 which, in turn, has its output connected to the synchronized clock output terminal 3.

Figure 12:
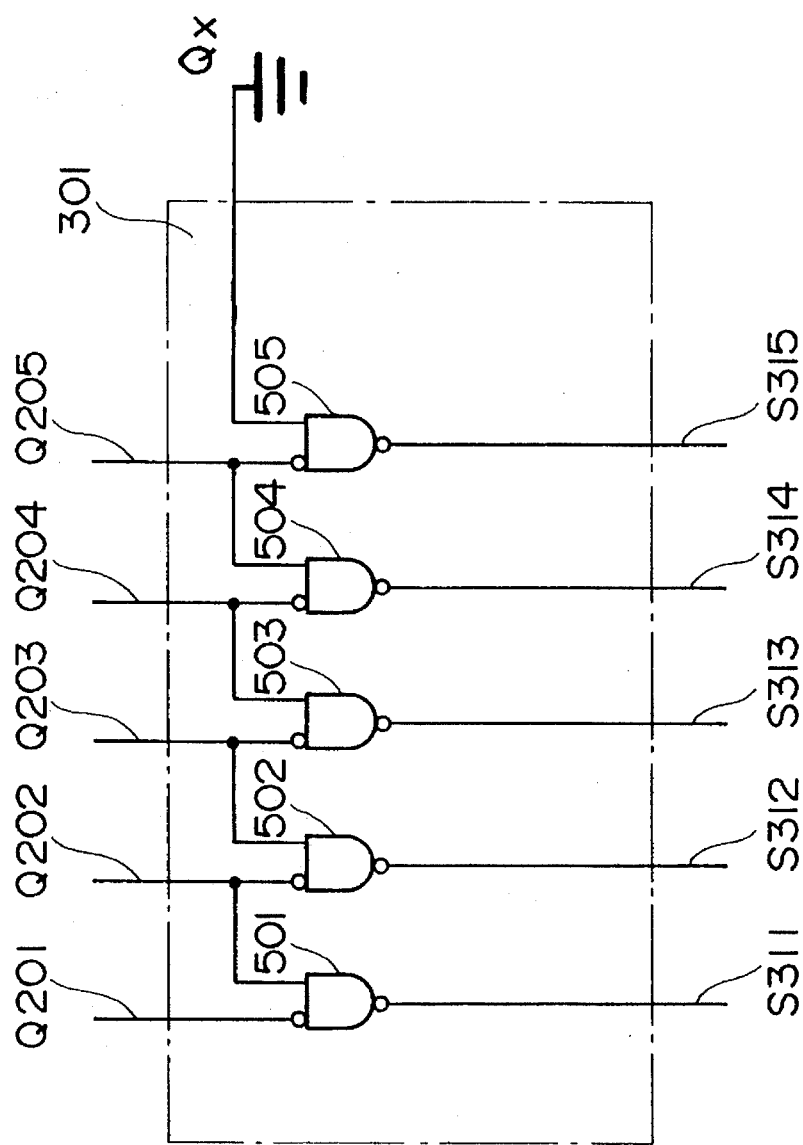
FIG. 12 shows an example of a circuit for detecting changes in output of flip-flops of the clock selection circuit shown in FIG. 11.

FIG. 12 is a circuit diagram of an example of a flip-flop output transition detecting circuit 301 which is part of the clock selection circuit 221 shown in FIG. 11. As shown in FIG. 12, the output signals from two adjacent ones of the flip-flops 201–205 are applied to associated ones of NAND circuits 501–505, with one output signal being inverted and with the other being uninverted. The NAND circuits develop respective output signals S311–S315 which are at the "L" level when the levels of the two inputs to it are "L" and "H", respectively, and which are otherwise at the "H" level.

Now the operations of the clock selection circuit shown in FIG. 11 and the flip-flop output transition detecting circuit 301 shown in FIG. 12 are described. The flip-flop output detecting circuit 301 compares inverted and uninverted outputs from two adjacent ones of the flip-flops 201–205 by means of the associated ones of the NAND circuits 501–505. One of the NAND circuits 501–505 develops the "L" level signal when it receives "L" and "H" level input signals. The L level signal thus developed renders conductive an associated one of the switches 311–315. In the example of which the timing chart is shown in FIG. 10, when Q202 and Q203 are at the "L" and "H" levels, respectively, the output signal S312 of the NAND circuit 502 is at the "L" level so that the associated switch 312 shown in FIG. 11 becomes conductive. When one of the switches 311–315 becomes conductive, an associated one of the delayed clock signals DC2–DC6 (the delayed clock signal DC3 in the example shown in FIG. 10) is coupled via the conductive switch to an input of a multiple-input OR circuit 321, and the multiple-input OR circuit 321 provides the received delayed clock signal as the synchronized clock signal S3 at the synchronized signal output terminal 3.

Figure 13:
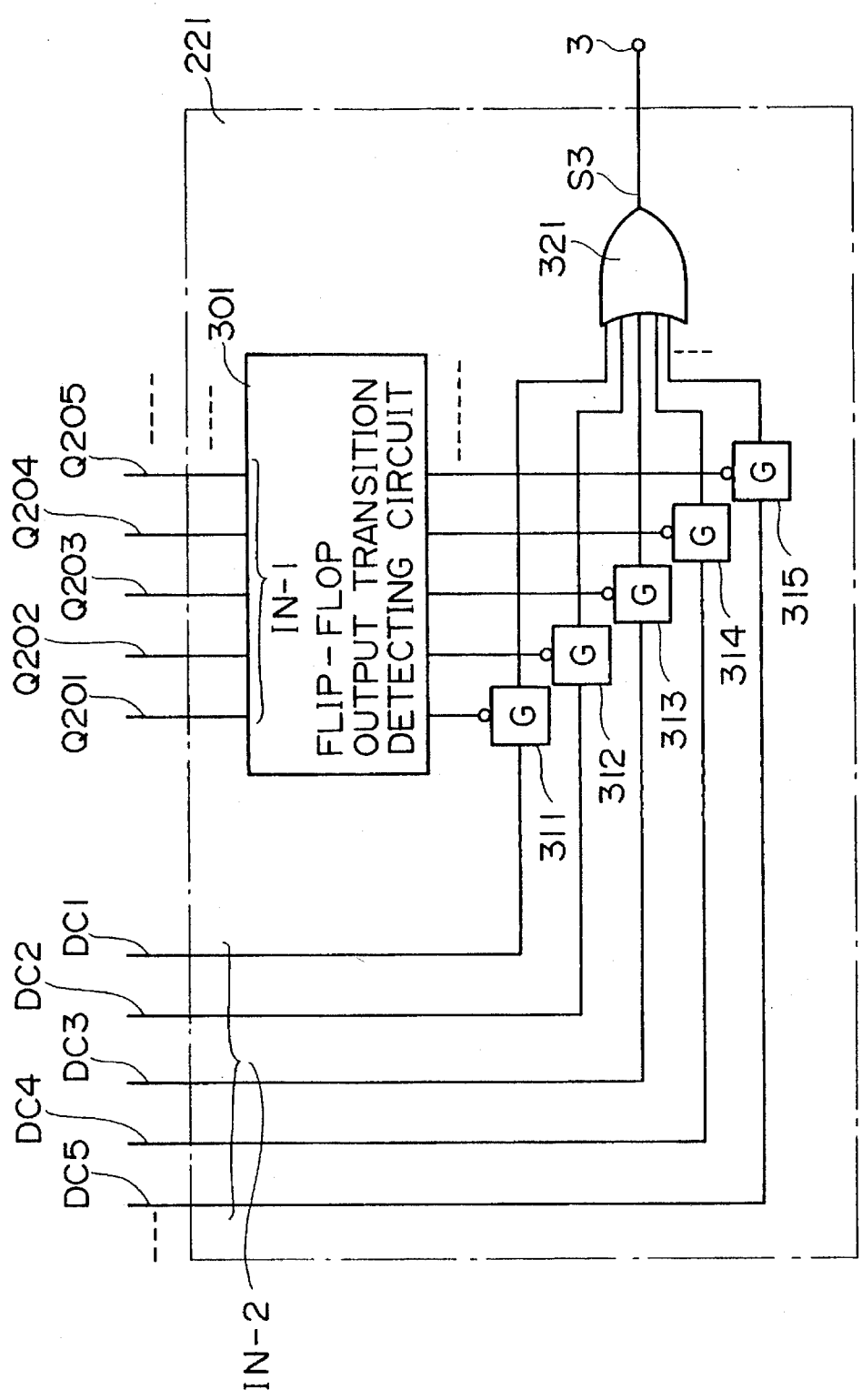
FIG. 13 shows another example of a clock selection circuit usable in the synchronized clock generating apparatus shown in FIG. 9.

FIG. 13 is a circuit diagram of another example of the clock selection circuit usable in the synchronized clock generating apparatus according to the third embodiment shown in FIG. 9. In this example, the delayed clock signals DC1–DC5 are applied to the inputs of the respective switches 311–315. The remainder of the circuit shown in FIG. 13 is similar to that of the circuit shown in FIG. 11.

The clock selection circuit shown in FIG. 13 provides a different signal as the synchronized clock signal S3 at the output terminal 3 from the circuit shown in FIG. 11 under the same timing condition. More specifically, for example, under the timing condition for the synchronized clock signal DC3 to be selected in the example of FIG. 11, the clock selection circuit of FIG. 13 selects the synchronized clock signal DC2. That is, the delayed clock signal which is a delayed version of the signal DC2 is developed. Thus, by appropriately changing the coupling of the delayed clock signals to the switches, a desired one of the delayed clock signals can be provided as the synchronized clock signal S3 at the synchronized clock output terminal 3.

The circuit shown in FIG. 11 is so arranged that the delayed clock signal DC1 cannot be selected as the synchronized clock signal S3, whereas in the circuit of FIG. 13, the delayed clock signal from the last-stage delaying element is not selected. However, by using such a number of delaying elements as to provide a total delay of longer than one period of the basic clock signal for the delayed clock generating circuit, a delayed clock signal in phase with the delayed clock signal DC1 appears after the delayed clock signal DC5, which can be selected as the synchronized clock signal S3. In the circuit shown in FIG. 13, by using such a number of delaying elements as to provide a total delay of longer than one period of the basic clock signal in the delayed clock generating circuit, a delayed clock signal which is in phase with the delayed clock signal provided by the last-stage delaying element appears before the last delayed clock signal and can be selected as the synchronized clock signal S3.

It should be noted that although a negative-going edge (transition) is described as an effective edge at the clock input terminals T of the flip-flops 201–205, a positive-going edge (transition) may be used instead.

Furthermore, the coupling between the delayed clock signals and the switches is not restricted to the ones shown in FIGS. 11 and 13.

In the third embodiment, the delayed clock signal having a transition which occurs later than but closest to a transition in the asynchronous trigger signal TR applied to the asynchronous trigger signal input terminal 1 is used to select a desired delayed clock signal as the synchronized clock signal, but a delayed clock signal having a transition which occurs earlier than but closest to a transition in the asynchronous trigger signal TR may be instead used to select a desired delayed clock signal.

Furthermore, in this embodiment, the reset signal RS, applied at the reset signal input terminal 4 from the reset signal source 110, is also applied to the RESET input terminals R of the respective flip-flops 201–205. Alternatively, a set signal input terminal may be provided in place of the reset signal input terminal 4 to apply a set signal to SET input terminals of the flip-flops 201–205. In this case, the same result can be obtained.

Embodiment 4

Figure 14:
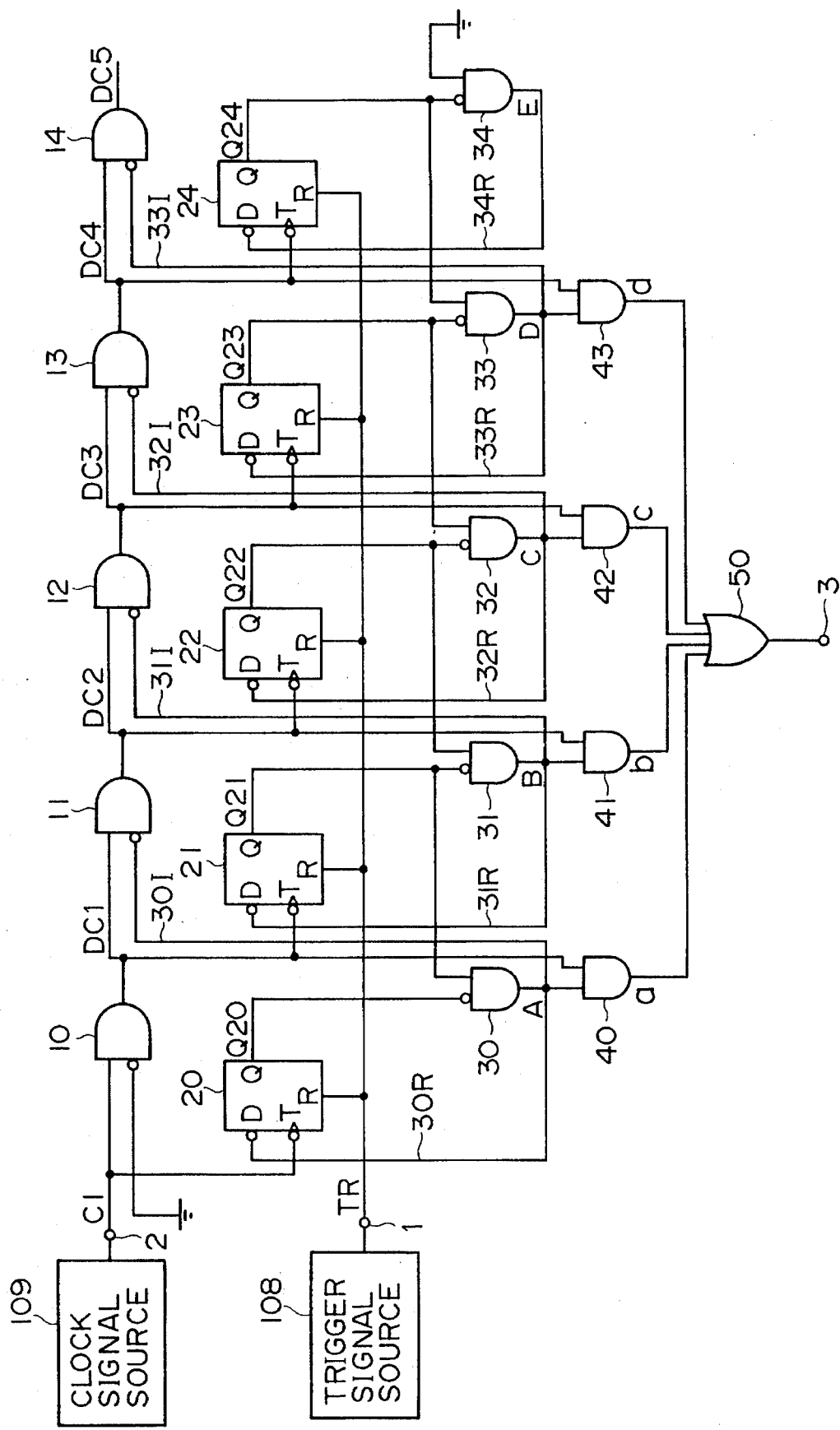
FIG. 14 is a block diagram of a synchronized clock generating apparatus according to a fourth embodiment of the present invention.

FIG. 14 is a block diagram of a synchronized clock generating apparatus according to a fourth embodiment of the present invention. In FIG. 14, delaying elements 10, 11, 12, 13, and 14 are connected in series. Each of the delaying elements 10–14 comprises, for example, an AND circuit which provides a substantially constant time delay of, for example, 1 ns. The series combination of the delaying elements provides a delayed clock generating circuit.

A basic clock signal C1 is applied from a clock signal source 109 to an input terminal 2 of the apparatus. The basic clock signal C1 applied at the input terminal 2 is coupled to a first (non-inverting) input terminal of the first-stage delaying element 10 of which a second (inverting) input terminal is grounded. The outputs of the respective delaying elements 10–14 are coupled to first (non-inverting) input terminals of the respective succeeding stage delaying elements, so that the respective delaying elements 10–14 generate, at their respective output terminals, clock signals DC1, DC2, DC3, DC4 and DC5 which are delayed versions of the clock signals applied to the respective first input terminals and delayed by a substantially constant delay time.

Flip-flops, edge-triggered D flip-flops in the illustrated embodiment, 20, 21, 22, 23, and 24 are connected in such a manner that the first-stage flip-flop 20 receives, at its clock input terminal T, the undelayed, basic clock signal C1 applied at the input terminal 2, and the flip-flops 21–24 receive, at their respective clock input terminals T, the delayed clock signals DC1–DC4 from the delaying elements 10–13, respectively.

A trigger signal source 108 provides a trigger signal TR which is applied to a trigger signal input terminal 1 asynchronously with the basic clock signal C1. The trigger signal TR is coupled to RESET input terminals R of the respective flip-flops 20–24. The flip-flops 20–24 produce output signals Q20, Q21, Q22, Q23 and Q24, respectively.

AND circuits 30, 31, 32, 33, and 34 form a SET detecting circuit which detects which one of the flip-flops 20–24 is set first after the trigger signal is applied to the flip-flops to release them from the reset states. The AND circuit 30 receives the output Q20 from the first-stage flip-flop 20 at its first (inverting) input terminal, the AND circuit 31 receives the output Q21 of the second-stage flip-flop 21 at its first (inverting) input terminal, the AND circuit 32 receives the output Q22 of the third flip-flop 22 at its first (inverting) input terminal, the AND circuit 33 receives the output Q23 of the fourth flip-flop 23 at its first (inverting) input terminal, and the AND circuit 34 receives the output Q24 of the fifth flip-flop 24 at its first (inverting) input terminal. The AND circuit 30 receives, at its second (non-inverting) input terminal, the output Q21 of the second flip-flop 21, the AND circuit 31 receives, at its second (non-inverting) terminal, the output Q22 of the third flip-flop 22, the AND circuit 32 receives, at its second (non-inverting) input terminal, the output Q23 of the fourth flip-flop 23, and the AND circuit 33 receives, at its second (non-inverting) input terminal, the output Q24 of the fifth flip-flop 24. In the illustrated embodiment of FIG. 14, the second (non-inverting) input terminal of the AND circuit 34 is grounded.

The output A of the AND circuit 30 is returned to the DATA input terminal D of the flip-flop 20 through a return path 30R and is also coupled to the second (inverting) input terminal of the delaying element 11 through an inhibit path 30I. Similarly, the output B of the AND circuit 31 is returned to the DATA input terminal D of the flip-flop 21 through a return path 31R and is also coupled to the second (inverting) input terminal of the delaying element 12 through an inhibit path 31I, and the output C of the AND circuit 32 is coupled to the DATA input terminal D of the flip-flop 22 through a return path 32R and also to the second (inverting) input terminal of the delaying element 13 through an inhibit path 32I. The output D of the AND circuit 33 is returned to the DATA input terminal D of the flip-flop 23 through a return path 33R and is also coupled to the second (inverting) input terminal of the delaying element 14 through an inhibit path 33I. The output E of the AND circuit 34 is returned to the DATA input terminal D of the flip-flop 24 through a return path 34R, and, if necessary, is coupled to the second input terminal of the succeeding one of the series-connected delaying elements of the delayed clock generating circuit.

AND circuits 40, 41, 42 and 43 form a clock signal detecting logic circuit which detects a desired clock signal after the flip-flops 20–24 are released from the reset state. The AND circuit 40 receives the output A of the AND circuit 30 and the delayed clock signal DC1 of the delaying element 10 at two input terminals thereof, respectively. The AND circuit 41 receives, at its two input terminals, the output B of the AND circuit 31 and the delayed clock signal DC2 of the delaying element 11, respectively. The AND circuit 42 receives, at its two input terminals, the output C of the AND circuit 32 and the delayed clock signal DC3 of the delaying element 12, respectively. The AND circuit 43 receives, at its two input terminals, the output D of the AND circuit 33 and the delayed clock signal DC4 of the delaying element 13, respectively. The respective AND circuits 40, 41, 42 and 43 develop output signals a, b, c, and d, which output signals are applied to an OR circuit 50. The output of the OR circuit 50 is coupled to a synchronized clock output terminal 3 at which a clock signal which is in synchronization with the trigger signal is provided.

Figure 15:
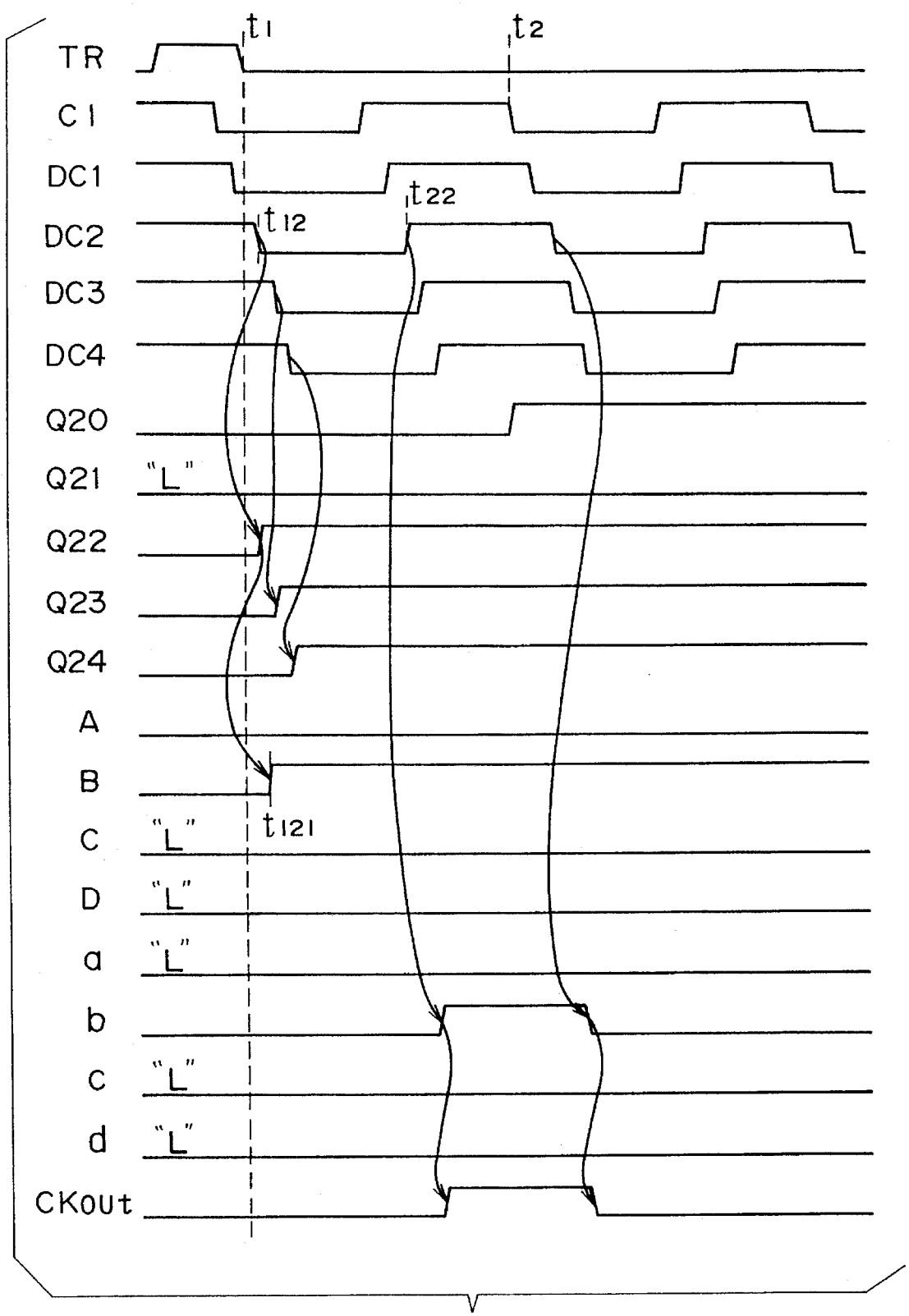
FIG. 15 is a timing diagram for use in explaining the operation of the synchronized clock generating apparatus shown in FIG. 14, where there are no variations in operating speed among components forming the apparatus.

Now the operation of the apparatus shown in FIG. 14 is described with reference to various waveforms shown in FIG. 15. FIG. 15 shows waveforms appearing at various portions of the apparatus of FIG. 14, on the assumption that there are no variations in operating speed among respective components of an IC forming the apparatus of FIG. 14, e.g., variations in flip-flop recovery time (a time necessary for a flip-flop to be able to respond to a clock signal after it is released from the reset state) among the flip-flops 20–24.

Each of the edge-triggered D flip-flops 20–24 takes in the inverted version ($\bar{D}$) of data applied to its DATA input terminal D when a falling edge (negative-going transition) occurs in the trigger signal TR.

When a falling edge occurs at a time t, in the trigger signal TR, the respective flip-flops are released from the reset state. Since falling edges in the clock signals C1 and DC1 applied to the clock input terminals T of the flip-flops 20 and 21, respectively, occur before these flip-flops are released from the reset state by the trigger signal TR, these flip-flops 20 and 21 are not set and, therefore, their outputs Q20 and Q21 are at the "L" level. A falling edge occurs in the delayed clock signal DC2 applied to the clock input terminal T of the flip-flop 22, at a time $t_{12}$ which is later than the release of the flip-flop 22 from its reset state. Falling edges occur in the clock signals DC3 and DC4 later than the time $t_{12}$ and, accordingly, later than the release of these flip-flops from the reset state by the trigger signal TR. Accordingly, these flip-flops 22, 23 and 24 are set to develop the output signals Q22, Q23 and Q24 at the "H" level. This causes the output A of the AND circuit 30 to be "L", the output B of the AND circuit 31 to change to "H" at a time $t_{121}$, and the outputs C and D of the AND circuits 32 and 33, respectively, to be both "L". This indicates that the delayed clock signal which changes from "H" to "L" first after the trigger signal TR has released the flip-flops from the reset state is the delayed clock signal DC2.

The respective outputs from the AND circuits 30–34 are returned to the DATA input terminals D of the corresponding flip-flops 20–24. This causes the output Q20 of the flip-flop 20 to change to "H" at a next falling edge $t_2$ in the clock signal C1 and the other flip-flops 21–24 remain in the previous state even when the next transitions occur in the delayed clock signals DC1–DC4. In other words, the output Q21 of the flip-flop 21 remains "L", whereas the outputs Q22–Q24 of the flip-flops 22–24 remain "H". Finally, the condition results in which Q20=H, Q21=L, Q22=H, Q23=H, and Q24=H. Accordingly, only the output B of the AND circuit 31 is maintained at the "H" level. The output B turns on the AND circuit 41 so that only the delayed clock signal DC2 appears as the output b of the AND circuit 41, which output b is fed through the OR circuit 50 to the synchronized clock output terminal 3. Thus the delayed clock signal DC2 is developed as a clock signal $CK_{out}$ which is synchronized with the trigger signal TR. Needless to say, the outputs a, c and d from the AND circuits 40, 42 and 43, respectively, are at the "L" level, since these AND circuits are not conductive.

In the above-described manner, it is known that the clock signal having a transition from "H" to "L" occurring first after the flip-flops are released from the reset state by the trigger signal TR is the delayed clock signal DC2, and, this delayed clock signal DC2 in the illustrated embodiment is developed at the output terminal 3 as the output clock signal $CK_{out}$ which is in synchronization with the trigger signal TR.

The "H" output B of the AND circuit 31 is applied through the inhibit path 31I to the second (inverting) input terminal of the delaying element 12 to inhibit the operation of the delaying element 12 so that no clock signals can pass through the delaying element 12. This causes the delayed clocks DC3 and DC4 to be actually at the "L" level so that the outputs c and d of the AND circuits 42 and 43 are at the "L" level regardless of the states of the AND circuits 32 and 33 (which are actually non-conductive). Thus, as stated previously, at the output terminal 3, the output clock signal $CK_{out}$ corresponding to the delayed clock signals DC2 appears.

Under the condition where there is no variation in operating speed among the components of the IC as assumed in the above discussion, the inhibit paths 30I–33I are not particularly necessary. However, if there are variations in operating speed among the components in the IC, as in the case which will be discussed, the inhibit paths 30I–33I act advantageously to prevent an inappropriate clock signal from being developed as the output of the apparatus.

Figure 16:
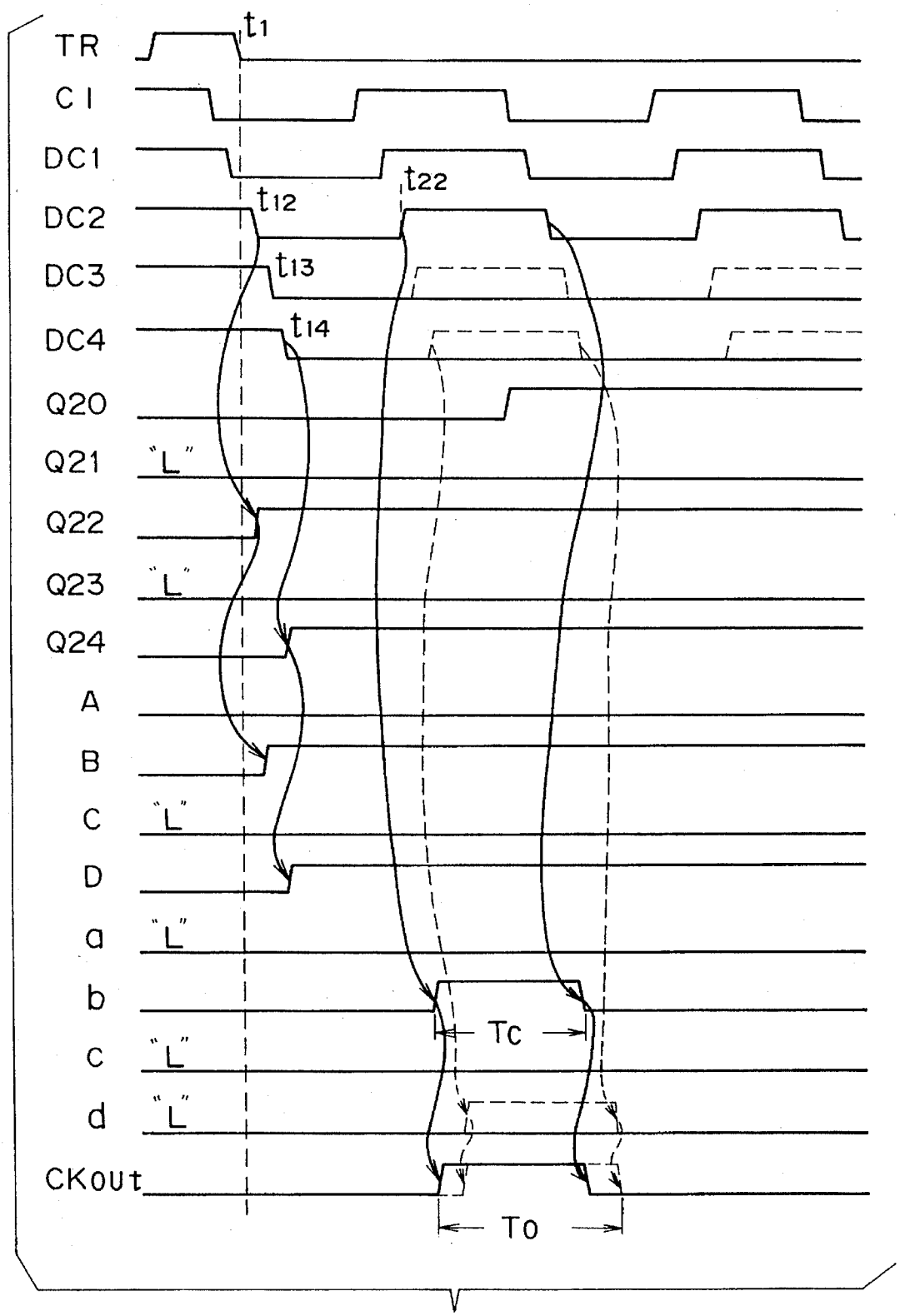
FIG. 16 is a timing diagram for use in explaining the operation of the synchronized clock generating apparatus shown in FIG. 14, where there are variations in operating speed of components forming the apparatus.

FIG. 16 shows waveforms for explaining the operation of the apparatus shown in FIG. 14 which has variations in operating speed of the flip-flops or, more specifically, variations in recovery time of the flip-flops (i.e. a time necessary for a flip-flop to respond to a clock signal after it is released from the reset state). In the illustrated example, the recovery time of the flip-flop 23 is longer than that of the remaining flip-flops so that, when the first falling edge in the delayed clock signal DC3 occurring after the application of a falling edge in the trigger signal TR to the trigger signal input terminal 1 at a time $t_1$, reaches the flip-flop 23 at a time $t_{13}$ the flip-flop 23 cannot take in the applied delayed clock signal DC3.

First, let it be assumed that the inhibit paths 30I–33I were not provided. After the trigger signal TR is applied, the flip-flop 22 is set by a falling edge occurring at a time $t_{12}$ in the delayed clock signal DC2 so that the output Q22 goes to "H". As stated above, the flip-flop 23 has a longer recovery time and, therefore, is not set by the falling edge occurring in the delayed clock signal DC3 at the time $t_{13}$. The flip-flop 24 is set by a falling edge occuring at a time $t_{14}$ in the delayed clock signal DC4 and, accordingly, the output Q24 goes to "H". Thus, after the trigger signal is applied, and immediately after the occurrences of the first falling edges in the respective delayed clock signals DC2, DC3 and DC4, the outputs of the respective flip-flops are, Q20=L, Q21=L, Q22=H, Q23=L and Q24=H. This causes the AND circuit 30 to be non-conductive, the AND circuit 31 to be conductive, the AND circuit 32 to be non-conductive, the AND circuit 33 to be conductive, and the AND circuit 34 to be non-conductive. That is, in addition to the output B of the AND circuit 31 which is at the "H" level as required, the output D of the AND circuit 33 is undesirably at the "H" level. The outputs of the AND circuits 30–34 are returned to the DATA input terminals of the respective associated flip-flops 20–24 through the associated return paths 30R–34R, whereby the output Q20 of the flip-flop 20 changes from "L" to "H" with the outputs of the other flip-flops remaining in the previous states. That is, Q20=H, Q21=L, Q22=H, Q23=L and Q24=H.

Then both of the AND circuits 41 and 43 becomes conductive so that the output b corresponding to the delayed clock signal DC2 and the output d (indicated by a broken line) corresponding to the delayed clock signal DC4 are provided at the synchronized clock output terminal 3 through the OR circuit 50. Thus the synchronized clock signal $CK_{out}$ at the output terminal 3 is the sum of the output corresponding to the output b (indicated by a solid line) and the output corresponding to the output d (indicated by a broken line). As a result, the width $T_0$ of the pulse becomes greater than the nominal width $T_c$.

The inhibit paths 30I–33I prevent occurrence of such an undesirable condition.

As described previously, in response to the first falling edge occurring at $t_{12}$ in the delayed clock signal DC2, the output Q22 of the flip-flop 22 becomes "H" and, hence, the output B of the AND circuit 31 becomes "H". The output signal B is applied through inhibit path 31I to the second (inverting) input terminal of delaying element 12 to turn off delaying element 12. Thus no delayed clock signals are developed from delaying element 12 and from the succeeding delaying elements. Since the output A of the AND circuit 30 applied to the second input terminal of the delaying element 11 is "L", the delaying element 11 is conductive to permit the clock signal to pass through it so as to produce the delayed clock signal DC2. Thus, at the output terminal 3, only the output synchronized clock signal $CK_{out}$ corresponding to the delayed clock signal DC2 appears, regardless of variations in recovery time of the flip-flops.

Embodiment 5

In the fourth embodiment shown in FIG. 14, the flip-flop 22 detects and stores the delayed clock signal DC2 which presents the first falling edge after the flip-flops are released from the reset state by the application of the asynchronous trigger signal TR to the trigger signal input terminal 1, and this delayed clock signal DC2 is selected as the output synchronized clock signal $CK_{out}$ to be developed at the output terminal 3. However, when a clock signal at a higher frequency is used, it may occur that, before the output B of the AND circuit 31 goes to "H" in response to the output Q22, which has been changed to "H" by the setting of the flip-flop 22 by the delayed clock signal DC2, a rising edge occurs in the delayed clock signal DC2 at a time $t_{22}$ in FIG. 15. This will cause the width of the output signal pulse b of the AND circuit 41 to become narrower, and, hence, the width of the output synchronized clock signal pulse $CK_{out}$ will become narrower than its nominal width $T_c$. Thus, in order to avoid such an erroneous operation, it may be desirable to select the delayed clock signal DC3, instead of DC2, and provide it as the output synchronized clock signal $CK_{out}$ from the output terminal 3. The fifth embodiment shown in FIG. 17 is for that purpose.

Figure 17:
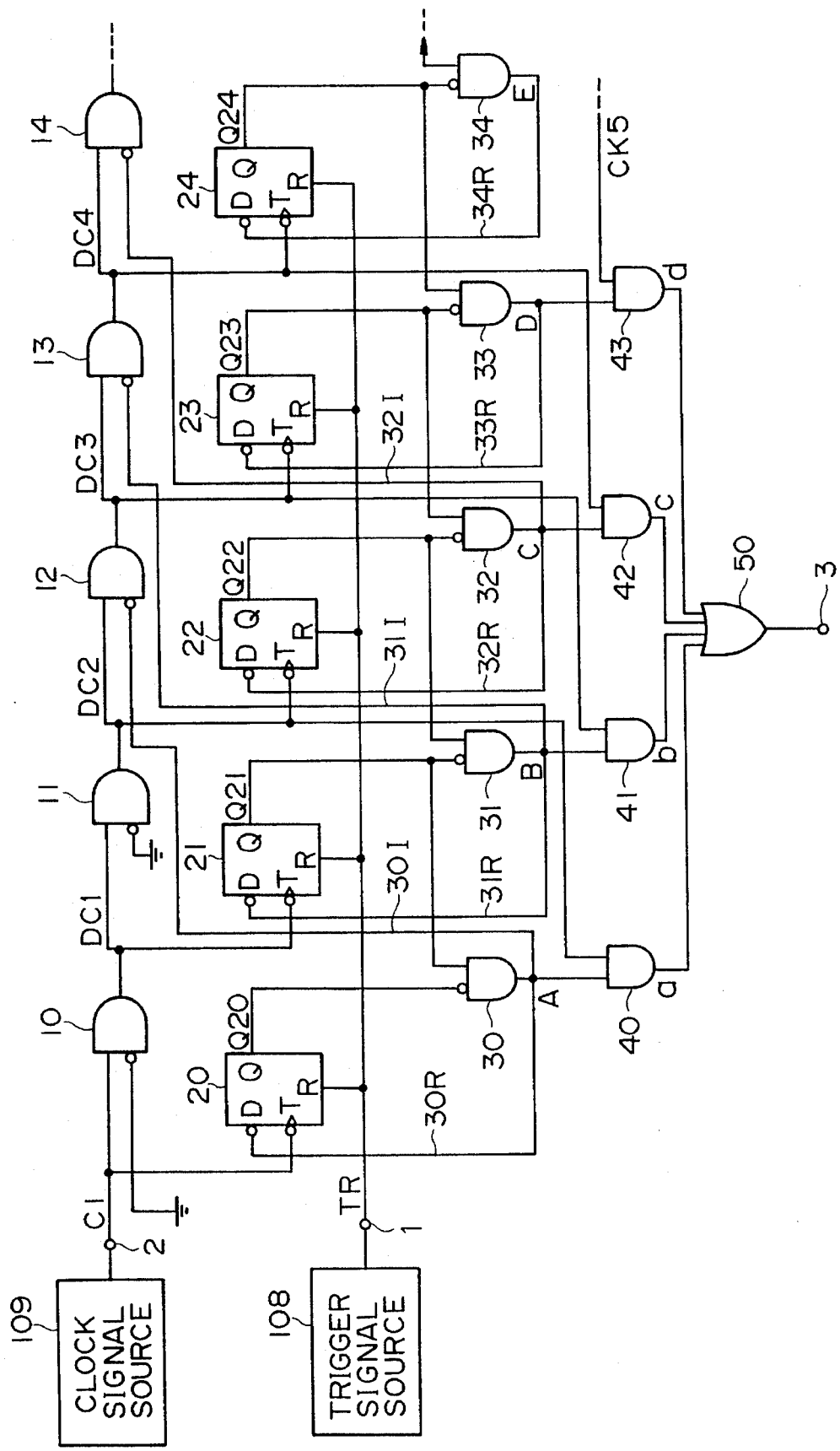
FIG. 17 is a block diagram of a synchronized clock generating apparatus according to a fifth embodiment of the present invention.

In the synchronized clock generating apparatus according to the fifth embodiment of the present invention shown in FIG. 17, the second (inverting) input terminal of the delaying element 11 is grounded. The inhibit path 30I is connected to the second input terminal of the delaying element 12. The inhibit path 31I is connected to the second input terminal of the delaying element 13. The inhibit path 32I is connected to the second input terminal of the delaying element 14. The AND circuit 40 receives the output A of the AND circuit 30 and the delayed clock signal DC2 at its input terminals. The AND circuit 41 receives the output B of the AND circuit 31 and the delayed clock signal DC3 at its input terminals. The AND circuit 42 receives the output C of the AND circuit 32 and the delayed clock signal DC4 at its input terminals, and the AND circuit 43 receives the output D of the AND circuit 33 and the delayed clock signal DC5 at its input terminals. The remaining configurations are the same as those of the fourth embodiment shown in FIG. 14.

In the apparatus shown in FIG. 17, too, when the asynchronous trigger signal TR is applied, the flip-flop 22 is set in response to the first falling edge occurring in the delayed clock signal DC2 at the time $t_{12}$ and, therefore, its output Q22 goes to "H". This turns on the AND circuit 31 so that the AND circuit 41 selects the delayed clock signal DC3 rather than the delayed clock signal DC2. The function of the inhibit paths 30I-32I is the same as in the fourth embodiment. In the example being described now, the output B of the AND circuit 31 at the "H" level is applied via the inhibit path 31I to the second input terminal of the delaying element 13 to inhibit a delayed clock signal from appearing at the output of the delaying element 13.

Embodiment 6

In the apparatus according to the fourth embodiment shown in FIG. 14, depending on the operating speeds of the flip-flops 20–24, the AND circuits 30–34, etc., and, depending on the speeds of the level changes of the delayed clock signals DC1–DC4, two inputs to the AND circuits 30–33 may change simultaneously. This is described in greater detail with reference to FIG. 15. In response to the falling edge at the time $t_{12}$ of the delayed clock signal DC2, the output Q22 of the flip-flop 22 changes to "H" and the output B of the AND circuit 31 changes to "H" at a time $t_{121}$.

If the operating speeds of the flip-flop 22 and the AND circuit 31 are high, the time $t_{12}$ when the falling edge occurs in the delayed clock signal DC2 and the time $t_{121}$ when the falling edge occurs in the output B of the AND circuit 31 may substantially coincide with each other. This would cause a spike to appear in the output b of the AND circuit 41, which spike may be undesirably coupled through the OR circuit 50 to the synchronized clock output terminal 3.

Figure 18:
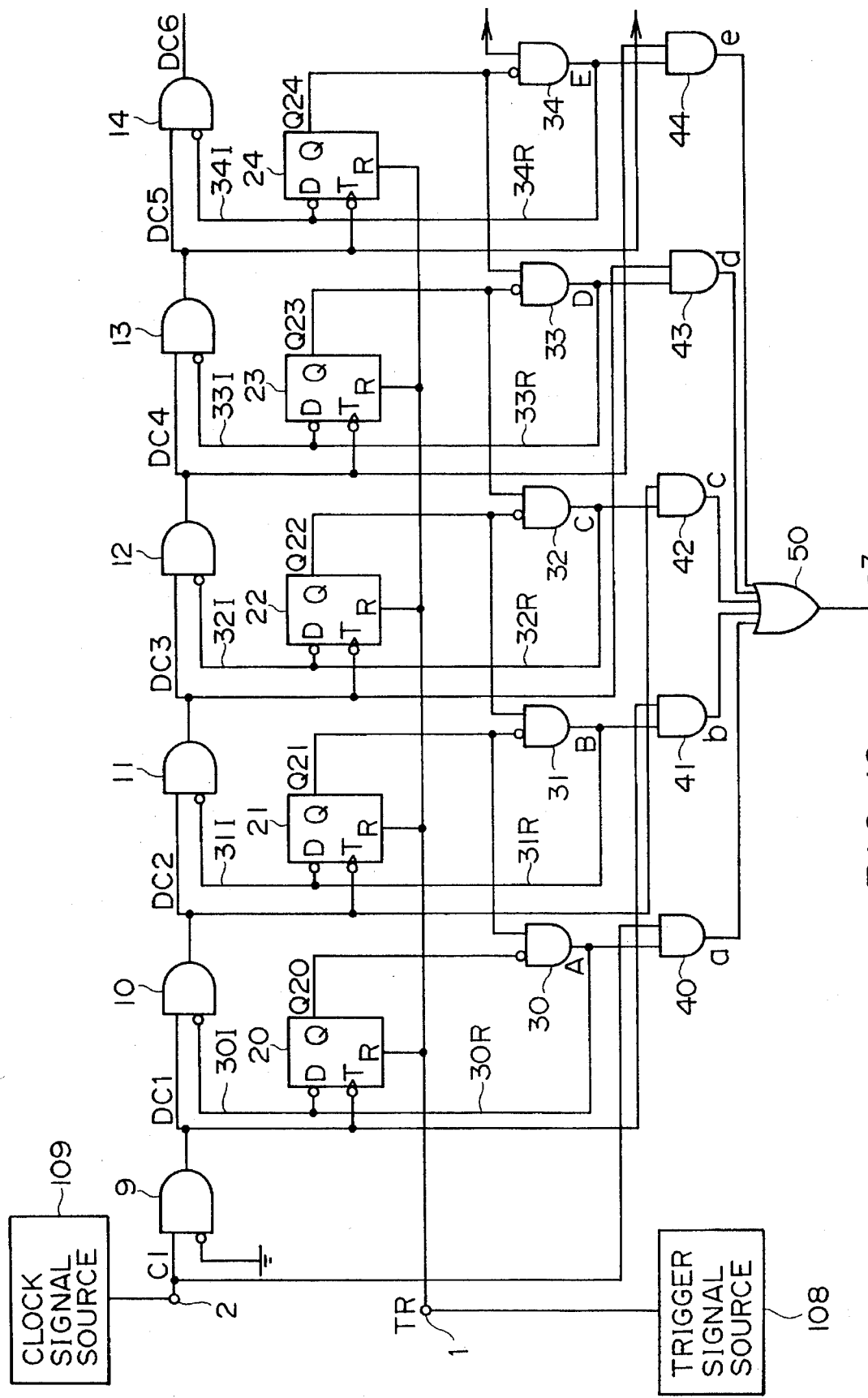
FIG. 18 is a block diagram of a synchronized clock generating apparatus according to a sixth embodiment of the present invention.

If the frequency of the clock signal is low so that the configuration shown in FIG. 17 need not be employed, the apparatus according to a sixth embodiment shown in FIG. 18 may be desirable. In FIG. 18, the components equivalent to those of the embodiment shown in FIG. 17 have the same reference numerals and are not further described. In the embodiment shown in FIG. 18, an additional delaying element 9 is used in the stage preceding the delaying element 10, and the clock signal C1 from the clock signal source 109 is applied to a first (non-inverting) input terminal of the delaying element 9 of which the second (inverting) input terminal is grounded. Thus, at the respective outputs of the delaying elements, delayed clock signals DC1–DC6 appear, which are successively delayed by a fixed time (e.g., 1 ns) from the preceding delayed clock signals.

The undelayed basic clock signal C1 is applied to one input of the AND circuit 40, and the delayed clock signals DC1–DC5 are applied respectively to the clock input terminals T of the flip-flops 20–24 and also to respective inputs of the AND circuits 41–44. The delayed clock signal DC6 may be applied to the succeeding delaying element (not shown) and to the succeeding AND circuit (not shown), as occasion demands. The outputs of the AND circuits 30–34 are returned through the respective return paths 30R–34R to the DATA input terminals D of the associated flip-flops 20–24 and also coupled through the inhibit paths 30I–34I to the second (inverting) input terminals of the respective associated delaying elements 10–14. The outputs from the AND circuits 40–44 are coupled to the OR circuit 50.

Figure 19:
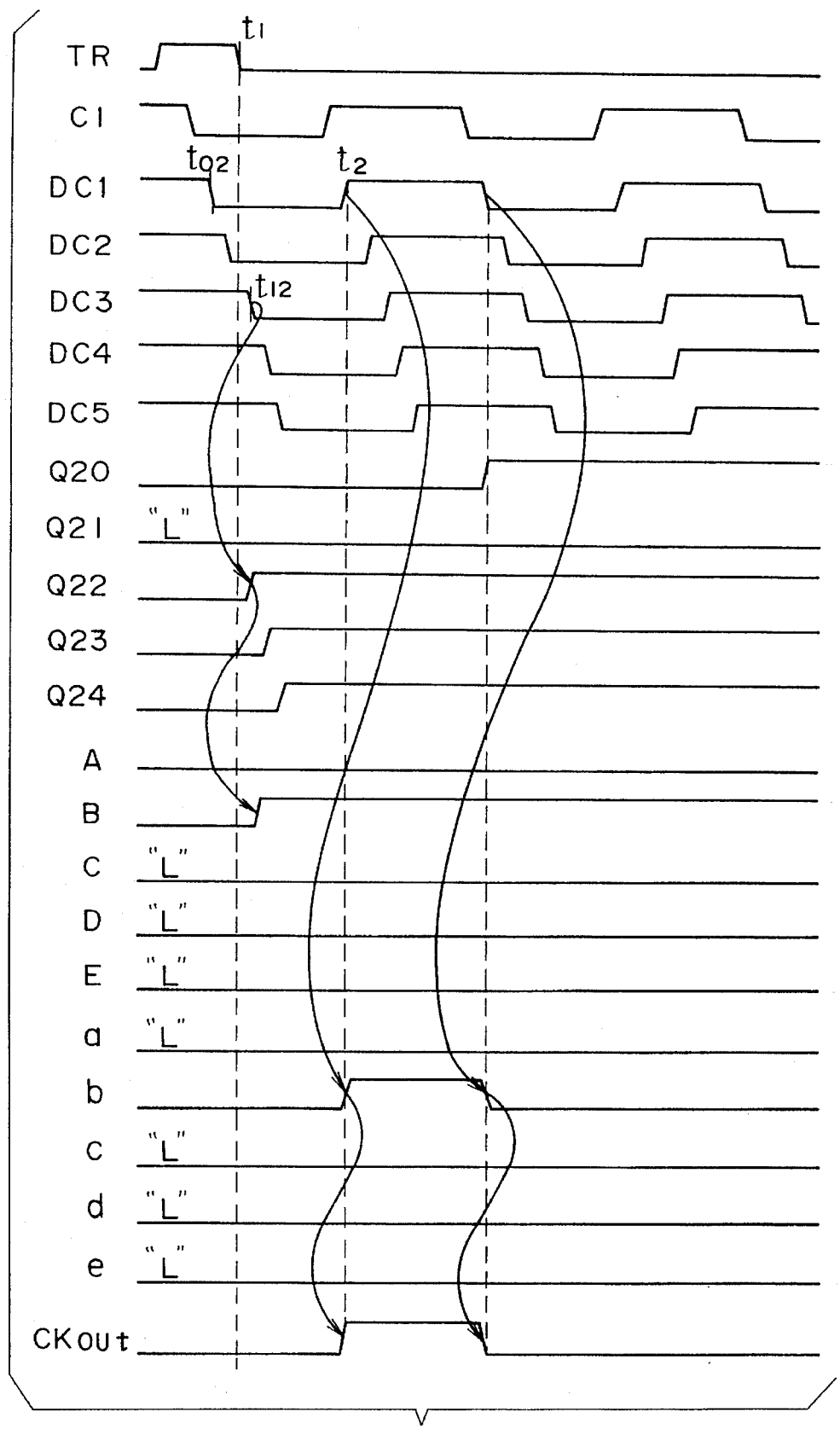
FIG. 19 is a timing diagram for use in explaining the operation of the synchronized clock generating apparatus shown in FIG. 18.

Now the operation of the apparatus of FIG. 18 is described with reference to FIG. 19. In this apparatus, too, the first falling edge appearing in the delayed clock signals after a falling edge occurring at a time $t_1$ in the trigger signal TR, that is, the falling edge occurring at a time $t_{12}$ in the delayed clock signal DC3 in the example shown in FIG. 19, sets an associated flip-flop, i.e., the flip-flop 22, so that its output, Q22, goes to the "H" level. At this instant, the output Q21 of the flip-flop 21 is "L", so the AND circuit 31 is rendered conductive to develop the output B at the "H" level. Thus the AND circuit 41 becomes conductive. Since the AND circuit 41 receives, at the other input terminal, the delayed clock signal DC1, the output b of the AND circuit 41 changes to the "H" level in response to a rising edge in the delayed clock signal DC1 occurring at a time $t_2$. Thus an output synchronized clock signal $CK_{out}$ corresponding to the delayed clock signal DC1 is provided at the synchronized clock output terminal 3. Since the level of the delayed clock signal DC1 is secured at "L" at a time $t_{02}$ which is earlier than the time $t_{12}$ when the falling edge occurs in the delayed clock signal DC3 which is detected first after the occurrence of a falling edge in the trigger signal TR, the two inputs to the AND circuit 41 never change simultaneously to produce a spike in the output as in the apparatus shown in FIG. 14.

The output synchronized clock signal $CK_{out}$ corresponding to the clock signal C1 or DC2 can be produced by slightly modifying the circuit connections.

The purpose of returning the outputs of the AND circuits 30–34 via the return paths 30R–34R to the DATA input terminals D of the associated flip-flops 20–24, and the purpose of coupling the outputs of the AND circuits 30–34 via the inhibit paths 30I–34I to the second (inverting) inputs of the associated delaying elements 10–14, are the same as the ones described with reference to the embodiments shown in FIGS. 14 and 17. In this sixth embodiment, the "H" output from the AND circuit 31 is applied to the second input terminal of the delaying element 11 to inhibit any delayed clock signal from being transmitted to the succeeding delaying elements.

According to the fourth, fifth and sixth embodiments, the trigger signal TR is applied to the RESET terminals of the respective flip-flops and the Q outputs of the flip-flops are utilized. However, the trigger signal TR may be applied to the SET input terminals of the flip-flops and the Q outputs may be utilized. In summary, the present invention can be implemented with such a logic that the delayed clock signal having a transition occurring first after the trigger signal is applied is detected, the detected delayed clock signal is returned via the return path to the flip-flop for storage, and the detected delayed clock signal or the preceding or succeeding one is selected as a desired delayed clock signal, using the detected delayed clock signal. The number of the serially connected delaying elements, 10–14 or 9–14, and the number of the flip-flops 20–24 may be changed depending on the circuit designs employed.

As described in detail, in the synchronized clock generating apparatus according to the present invention, a plurality of delayed clock signals are generated by a plurality of simple logic elements, such as buffer amplifiers and AND circuits, to select a desired one of the delayed clock signals in relation to the occurrence of an asynchronous trigger signal, and, accordingly, a jitter can be limited to a time equal to the delay time provided by one delaying element. Accordingly, a clock signal highly precisely synchronized with the trigger signal is available without resort to a high frequency clock signal generating circuit which generates a high frequency clock signals at, for example, 1 GHz. Thus, according to the present invention, a highly precisely synchronized clock signal generating apparatus can be manufactured at a low cost, which apparatus can be used widely in interfaces between systems operating with different basic clocks. Furthermore, in the synchronized clock generating apparatus according to the present invention, large high frequency noise or undesirable radiation are not produced so that it can be safely used in horizontal and vertical synchronizing circuits of image processing systems, such as a digital copying machine. In addition, it requires no special wafer processing for the apparatus to be integrated. Very ordinary processing is sufficient for making an apparatus with a jitter on the order of ±1 ns.

According to the present invention, once a desired clock signal is selected, the apparatus can operate correctly to provide the synchronized clock signal regardless of some variations in operating speed among the components forming the apparatus, by virtue of the inhibit paths provided between the outputs of the respective logic circuits and the associated delaying elements for inhibiting any delayed clock signals from being applied to the succeeding delaying elements.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a set state from a reset state in response to receiving said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying a selected one of said delayed clock signals to said selected clock output and a feedback signal to a selected feedback output of said feedback outputs in response to a first one of said flip-flop output signals switching to said set state; and feedback means for connecting said feedback outputs to said third input of respective ones of said plurality of flip flops.

2. A synchronized clock generating apparatus according to claim 1, wherein said plurality of delay elements having disabling inputs and said apparatus further comprises a plurality of inhibit paths for connecting said feedback outputs to said disabling inputs for inhibiting from being transmitted to said delaying elements any of said delayed clock signals succeeding said selected one of said delayed clock signals.

3. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a set state from a reset state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying a first one of said delayed clock signals having a transition after a transition of said trigger signal to said selected clock output and a feedback signal to a selected feedback output of said feedback outputs in response to a first one of said flip-flop output signals switching to said set state; and feedback means for connecting said feedback outputs to said third input of respective ones of said plurality of flip flops.

4. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a set state from a reset state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said dock selection circuit applying to said selected dock output a selected one of said delayed clock signals and a feedback signal to a selected feedback output of said feedback outputs in response to a first one of said flip-flop output signals switching to said set state;

said selected one of said delayed clock signals having a transition succeeding a first one of said delayed clock signals having a transition after a transition of said trigger signal, by a predetermined period; and feedback means for connecting said feedback outputs to said third input of respective ones of said plurality of flip flops.

5. A synchronized clock generating apparatus according to claim 4, wherein said plurality of delay elements having disabling inputs and said apparatus further comprises a plurality of inhibit paths for connecting said feedback outputs to said disabling inputs to inhibit from being transmitted to said delaying elements any of said delayed clock signals succeeding said selected one of said delayed clock signals.

6. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a set state from a reset state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to a first one of said flip-flop output signals switching to said set state;

said selected one of said delayed clock signals having a transition preceding a first one of said delayed clock signals having a transition after a transition of said trigger signal, by a predetermined period; and feedback means for connecting said feedback outputs to said third input of respective ones of said plurality of flip flops.

7. A synchronized clock generating apparatus according to claim 6, wherein said plurality of delay elements having disabling inputs and said apparatus further comprises a plurality of inhibit paths for connecting said feedback outputs to said disabling inputs for inhibiting from being transmitted to said delaying elements any of said delayed clock signals succeeding said selected one of said delayed clock signals.

8. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a set state from a reset state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to one of said flip-flop output signals switching to said set state and another one of said flip-flop outputs, preceding said one of said flip-flop output signals, being in said reset state;

said selected one of said delayed clock signals having a transition with a predetermined relationship to a said one of said delayed clock signals; and feedback means for connecting said feedback outputs to said third input of respective ones of said plurality of flip flops.

9. A synchronized clock generating apparatus according to claim 8 wherein said plurality of delay elements having disabling inputs and said apparatus further comprises a plurality of inhibit paths for connecting said feedback outputs to said disabling inputs for inhibiting from being transmitted to said delaying elements any of said delayed clock signals succeeding said selected one of said delayed clock signals.

10. A synchronized clock generating apparatus comprising:

a delayed clock generating circuit;

said delayed dock generating circuit including a clock input having a basic clock signal applied thereto;

said delayed clock generating circuit including further a plurality of delaying elements connected in series;

each of said plurality of delaying elements of said delayed clock generating circuit being a semiconductor logic element;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a set state from a reset state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to one of said flip-flop output signals switching to said set state and another one of said flip-flop outputs, preceding said one of said flip-flop output signals, being in said reset state;

said selected one of said delayed clock signals having a transition with a predetermined relationship to a said one of said delayed clock signals; and feedback means for connecting said feedback outputs to said third input of respective ones of said plurality of flip flops.

11. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

each of said plurality of delaying elements of said delayed clock generating circuit being a semiconductor logic element;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a set state from a reset state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying a selected one of said delayed clock signals to said selected clock output and a feedback signal to a selected feedback output of said feedback outputs in response to a first one of said flip-flop output signals switching to said set state; and feedback means for connecting said feedback outputs to said third input of respective ones of said plurality of flip flops.

12. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

each one of said plurality of delaying elements of said delayed clock generating circuit being a semiconductor logic element;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a set state from a reset state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying a first one of said delayed clock signals having a transition after a transition of said trigger signal to said selected clock output and a feedback signal to a selected feedback output of said feedback outputs in response to a first one of said flip-flop output signals switching to said set state; and feedback means for connecting said feedback outputs to said third input of respective ones of said plurality of flip flops.

13. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

each one of said plurality of delaying elements of said delayed clock generating circuit being a semiconductor logic element;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a set state from a reset state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to a first one of said flip-flop output signals switching to said set state;

said selected one of said delayed clock signals having a transition succeeding a first one of said delayed clock signals having a transition after a transition of said trigger signal, by a predetermined period; and feedback means for connecting said feedback outputs to said third input of respective ones of said plurality of flip flops.

14. A synchronized clock generating apparatus comprising:

a delayed clock generating circuit;

said delayed clock generating circuit including a clock input having a basic clock signal applied thereto;

said delayed clock generating circuit including further a plurality of delaying elements connected in series;

each one of said plurality of delaying elements of said delayed clock generating circuit being a semiconductor logic element;

said plurality of delaying elements being effective for producing a plurality of delayed clock signals each successively delayed relative to said basic clock signal;

a plurality of flip-flops, each having a respective one of said plurality of delayed clock signals applied to a first input thereof;

said plurality of flip-flops each having a second input with a trigger signal, asynchronous with said basic clock signal, applied thereto;

each of said plurality of flip-flops having a third input and a flip-flop output;

said plurality of flip-flops receiving said trigger signal and said delayed clock signals such that each flip-flop, of said plurality of flip-flops, switches a flip-flop output signal at said flip-flop output thereof to a set state from a reset state in response to receiving a transition of said respective one of said delayed clock signals after a transition of said trigger signal;

a clock selection circuit having a first plurality of inputs receiving said delayed clock signals, each of a second plurality of inputs receiving a respective one of said flip-flop output signals, a plurality of feedback outputs, and a selected clock output;

said clock selection circuit applying to said selected clock output a selected one of said delayed clock signals and a feedback signal to a selected feedback output of said feedback outputs in response to a first one of said flip-flop output signals switching to said set state;

said selected one of said delayed clock signals having a transition preceding a first one of said delayed clock signals having a transition after a transition of said trigger signal, by a predetermined period; and feedback means for connecting said feedback outputs to said third input of respective ones of said plurality of flip flops.

* * * * *